(12) United States Patent
Xie et al.

(10) Patent No.: US 11,749,661 B2
(45) Date of Patent: Sep. 5, 2023

(54) PACKAGE COMPRISING A SUBSTRATE AND A MULTI-CAPACITOR INTEGRATED PASSIVE DEVICE

(71) Applicant: QUALCOMM Incorporated, San Diego, CA (US)

(72) Inventors: Biancun Xie, San Diego, CA (US); Shree Krishna Pandey, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 115 days.

(21) Appl. No.: 17/364,318

(22) Filed: Jun. 30, 2021

(65) Prior Publication Data
US 2023/0005901 A1 Jan. 5, 2023

(51) Int. Cl.
H01L 25/00 (2006.01)
H01L 25/18 (2023.01)
H01L 27/01 (2006.01)
H01L 49/02 (2006.01)

(52) U.S. Cl.
CPC .............. *H01L 25/18* (2013.01); *H01L 25/50* (2013.01); *H01L 27/013* (2013.01); *H01L 28/40* (2013.01)

(58) Field of Classification Search
CPC .................................................... H01L 25/18
See application file for complete search history.

(56) References Cited

U.S. PATENT DOCUMENTS

| 9,548,288 | B1 | 1/2017 | Ramachandran et al. |
| 2021/0296283 | A1* | 9/2021 | Huang .................... H01L 25/50 |
| 2021/0391314 | A1* | 12/2021 | Jeng ........................ H01L 24/16 |
| 2022/0199759 | A1* | 6/2022 | Chyi Liu .......... H01L 21/31111 |
| 2022/0293513 | A1* | 9/2022 | Li ....................... H01L 23/5286 |

FOREIGN PATENT DOCUMENTS

WO 2017052471 A1 3/2017

OTHER PUBLICATIONS

Hou S.Y et al., "Integrated Deep Trench Capacitor in Si Interposer for CoWoS Heterogeneous Integration", 2019 IEEE International Electron Devices Meeting (IEDM), IEEE, Dec. 7, 2019 (Dec. 7, 2019), XP033714434, 4 Pages, DOI: 10.1109/IEDM19573.2019. 8993498, [Retrieved on Feb. 10, 2020], The Whole Document.
International Search Report and Written Opinion—PCT/US2022/ 031793—ISA/EPO—dated Oct. 11, 2022.

(Continued)

*Primary Examiner* — Thao P Le
(74) *Attorney, Agent, or Firm* — Loza & Loza, LLP

(57) ABSTRACT

A package that includes a substrate, an integrated device coupled to the substrate, and an integrated passive device comprising at least two capacitors. The integrated passive device is coupled to the substrate. The integrated passive device includes a passive device substrate comprising a first trench and a second trench, an oxide layer located over the first trench and the second trench, a first electrically conductive layer located over the oxide layer the first trench, a dielectric layer located over the first electrically conductive layer, and a second electrically conductive layer located over the dielectric layer.

27 Claims, 19 Drawing Sheets

CROSS SECTIONAL PROFILE VIEW

(56) References Cited

OTHER PUBLICATIONS

Mehdi J.M., "Multi-Terminal Ultra-Thin 3D Nanoporous Silicon Capacitor Technology for High-Speed Circuits Decoupling", 2022 IEEE 72nd Electronic Components And Technology Conference (ECTC), IEEE, May 31, 2022 (May 31, 2022), pp. 908-913, XP034147609, DOI: 10.1109/ECTC51906.2022.00148, [retrieved on Jul. 12, 2022], The Whole Document.

Mehdi J.M, et al., "Multi-Terminal Low-ESL 3D Silicon Capacitors as Enabler for Optimized and Flat PDN Design", 2021 IEEE 71st Electronic Components And Technology Conference (ECTC) IEEE, Jun. 1, 2021 (Jun. 1, 2021), pp. 1300-1306, XP033957000, DOI:10.1109/ECTC32696.2021.00210, [Retrieved on Jul. 28, 2021] The Whole Document.

* cited by examiner

PLAN VIEW

CROSS SECTIONAL PROFILE VIEW

PLAN VIEW

PLAN VIEW

CROSS SECTIONAL PROFILE VIEW

CROSS SECTIONAL PROFILE VIEW

CROSS SECTIONAL PROFILE VIEW

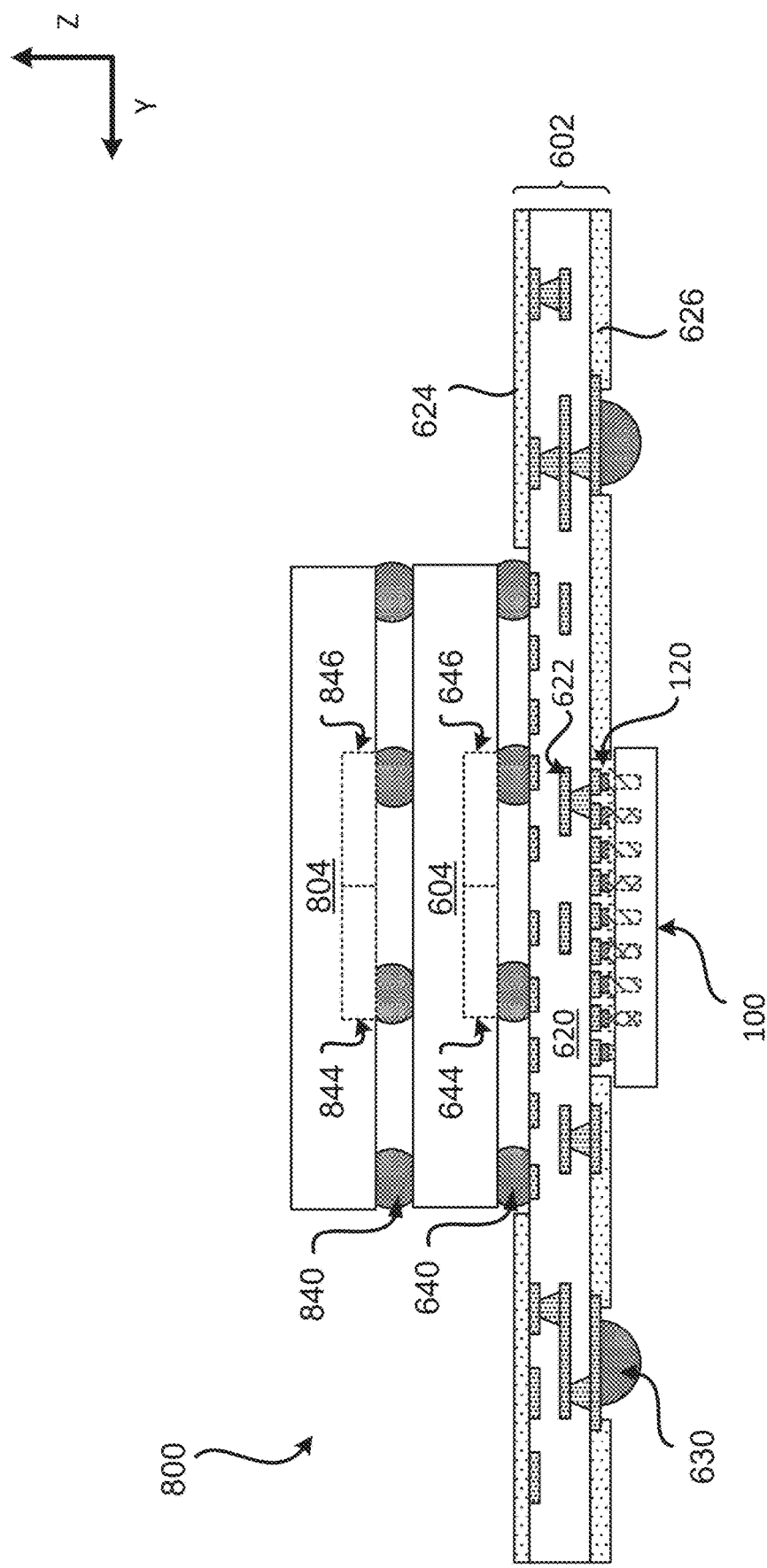

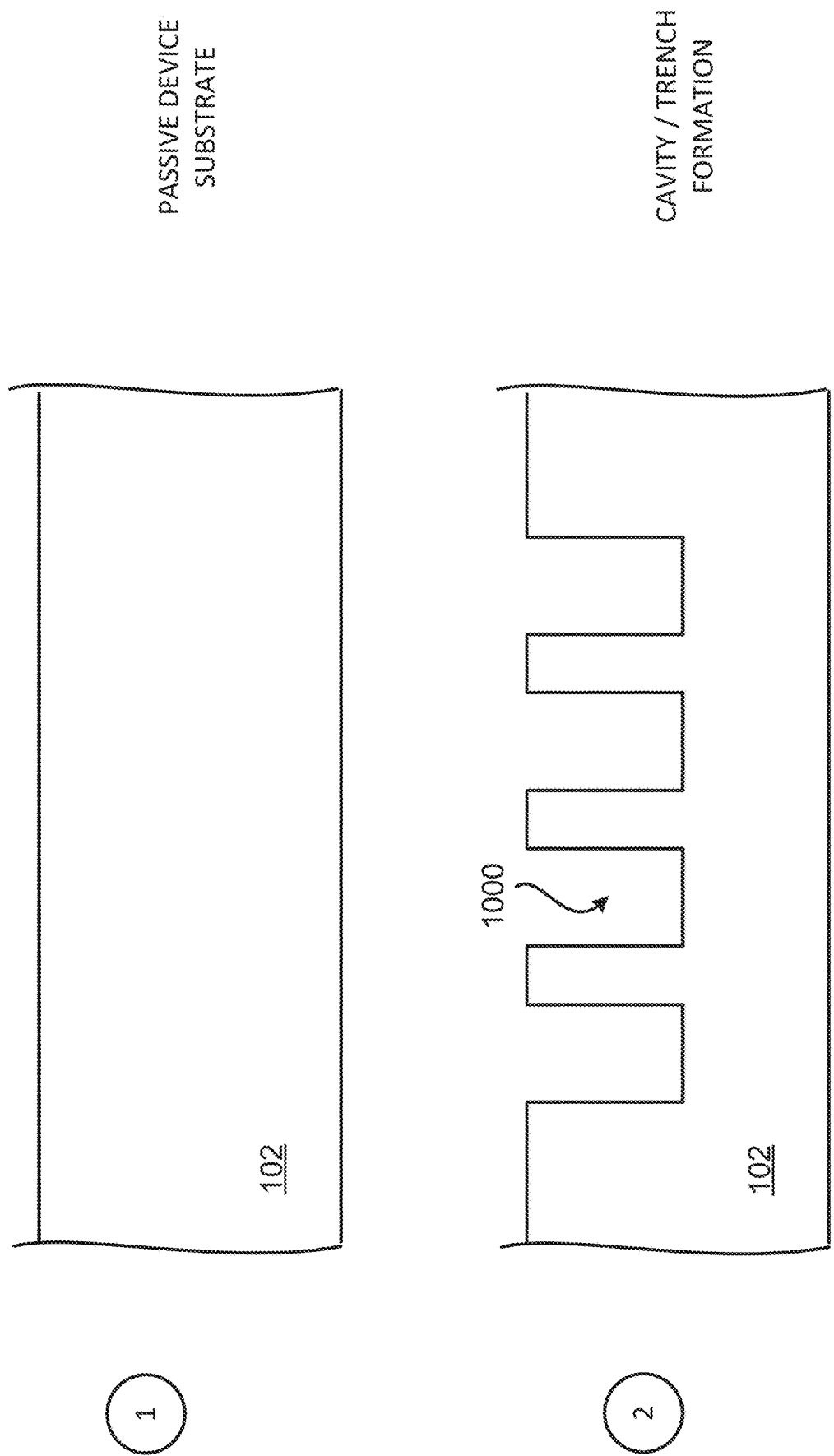

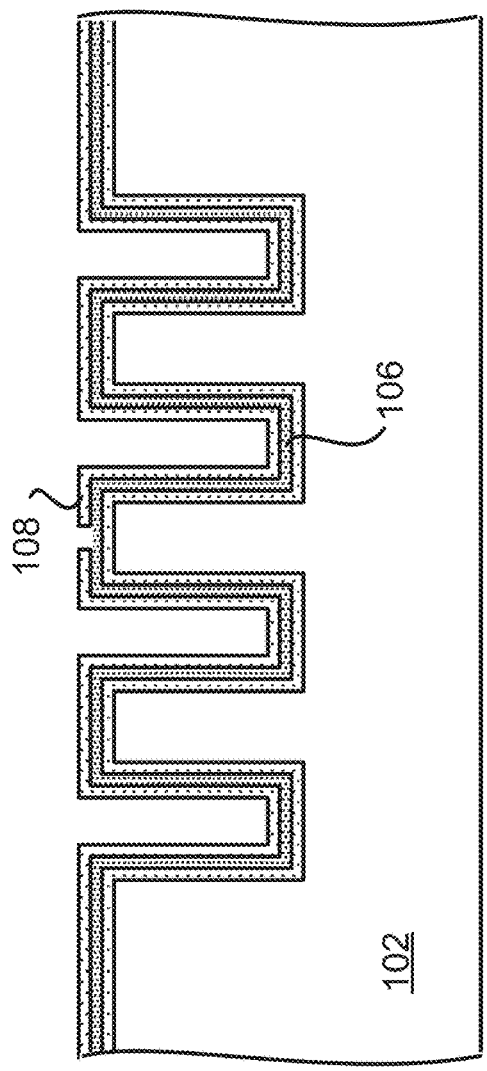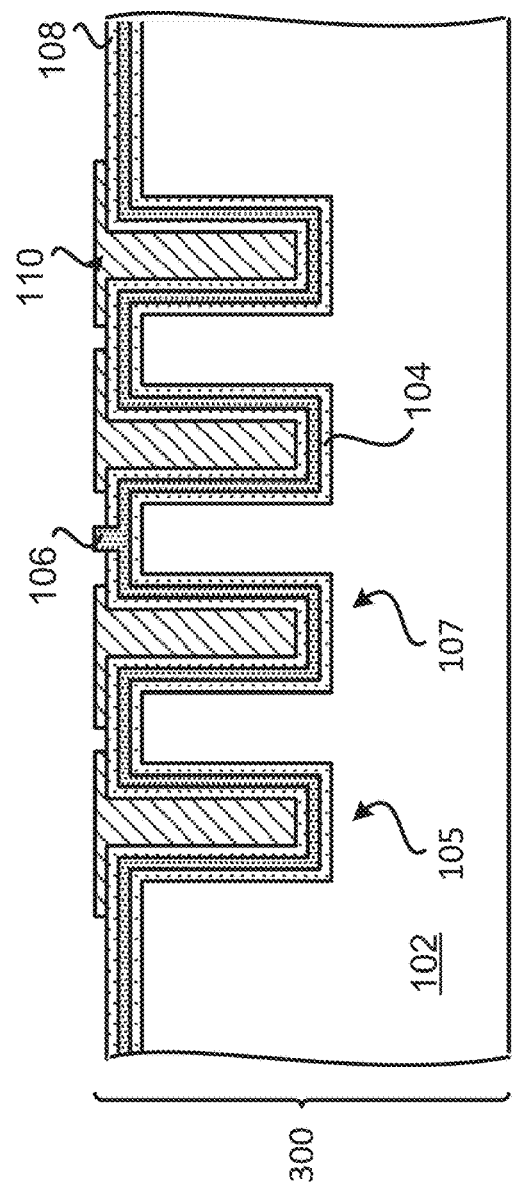
FIG. 10C

PACKAGE COMPRISING A SUBSTRATE AND A MULTI-CAPACITOR INTEGRATED PASSIVE DEVICE

FIELD

Various features relate to integrated passive devices.

BACKGROUND

A package may include a substrate, an integrated device and a passive device. These components are coupled together to provide a package that may perform various electrical functions. How the integrated device, the substrate and the passive component are coupled together affects how the package performs overall. There is an ongoing need to provide better performing packages.

SUMMARY

Various features relate to integrated passive devices.

One example provides a package comprising a substrate; an integrated device coupled to the substrate; and an integrated passive device coupled to the substrate. The integrated passive device comprises a first trench capacitor configured to be coupled to a first power; and a second trench capacitor configured to be coupled to a second power.

Another example provides a package that includes a substrate, an integrated device coupled to the substrate, and an integrated passive device comprising at least two capacitors. The integrated passive device is coupled to the substrate. The integrated passive device includes a passive device substrate comprising a first trench and a second trench, an oxide layer located over the first trench and the second trench, a first electrically conductive layer located over the oxide layer the first trench, a dielectric layer located over the first electrically conductive layer, and a second electrically conductive layer located over the dielectric layer. A first portion of the oxide layer, a first portion of the first electrically conductive layer, a first portion of the dielectric layer, and a first portion of the second electrically conductive layer that are located in the first trench of the passive device substrate are configured to operate as a first capacitor. A second portion of the oxide layer, a second portion of the first electrically conductive layer, a second portion of the dielectric layer, and a second portion of the second electrically conductive layer that are located in the second trench of the passive device substrate are configured to operate as a second capacitor.

Another example provides an apparatus comprising a substrate, an integrated device coupled to the substrate and means for multi-trench capacitance coupled to the substrate.

Another example provides a method for fabricating a package. The method provides a substrate. The method couples an integrated device to the substrate. The method couples an integrated passive device to the substrate. The integrated passive device comprises a first trench capacitor configured to be coupled to a first power; and a second trench capacitor configured to be coupled to a second power.

Another example provides a method for fabricating a package. The method provides a substrate. The method couples an integrated device to the substrate. The method couples an integrated passive device to the substrate. The integrated passive device includes at least two capacitors. The integrated passive device includes a passive device substrate comprising a first trench and a second trench, an oxide layer located over the first trench and the second trench, a first electrically conductive layer located over the oxide layer the first trench, a dielectric layer located over the first electrically conductive layer, and a second electrically conductive layer located over the dielectric layer. A first portion of the oxide layer, a first portion of the first electrically conductive layer, a first portion of the dielectric layer, and a first portion of the second electrically conductive layer that are located in the first trench of the passive device substrate are configured to operate as a first capacitor. A second portion of the oxide layer, a second portion of the first electrically conductive layer, a second portion of the dielectric layer, and a second portion of the second electrically conductive layer that are located in the second trench of the passive device substrate are configured to operate as a second capacitor.

BRIEF DESCRIPTION OF THE DRAWINGS

Various features, nature and advantages may become apparent from the detailed description set forth below when taken in conjunction with the drawings in which like reference characters identify correspondingly throughout.

FIG. 9 illustrates a cross sectional profile view of a package that includes a substrate and an integrated passive device comprising multi-capacitors.

FIGS. 10A-10C illustrate an exemplary sequence for fabricating an integrated passive device comprising multi-capacitors.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an integrated device coupled to the substrate, and an integrated passive device comprising at least two capacitors. The integrated passive device is coupled to the substrate. The integrated passive device includes a passive device substrate comprising a first trench and a second trench, an oxide layer located over the first trench and the second trench, a first electrically conductive layer located over the oxide layer the first trench, a dielectric layer located over the first electrically conductive layer, and a second electrically conductive layer located over the dielectric layer. A first portion of the oxide layer, a first portion of the first electrically conductive layer, a first portion of the dielectric layer, and a first portion of the second electrically conductive layer that are located in the first trench of the passive device substrate are configured to operate as a first capacitor (e.g., first trench capacitor). A second portion of the oxide layer, a second portion of the first electrically conductive layer, a second portion of the dielectric layer, and a second portion of the second electrically conductive layer that are located in the second trench of the passive device substrate are configured to operate as a second capacitor (e.g., second trench capacitor). The first capacitor may be configured to be coupled to a first power. The second capacitor may be configured to be coupled to a second power. The integrated passive device may be located closer to the integrated device. The integrated passive device comprising at least two capacitors provides a compact passive device that may help improve the power distribution network (PDN) performance of the package.

Figure 1:
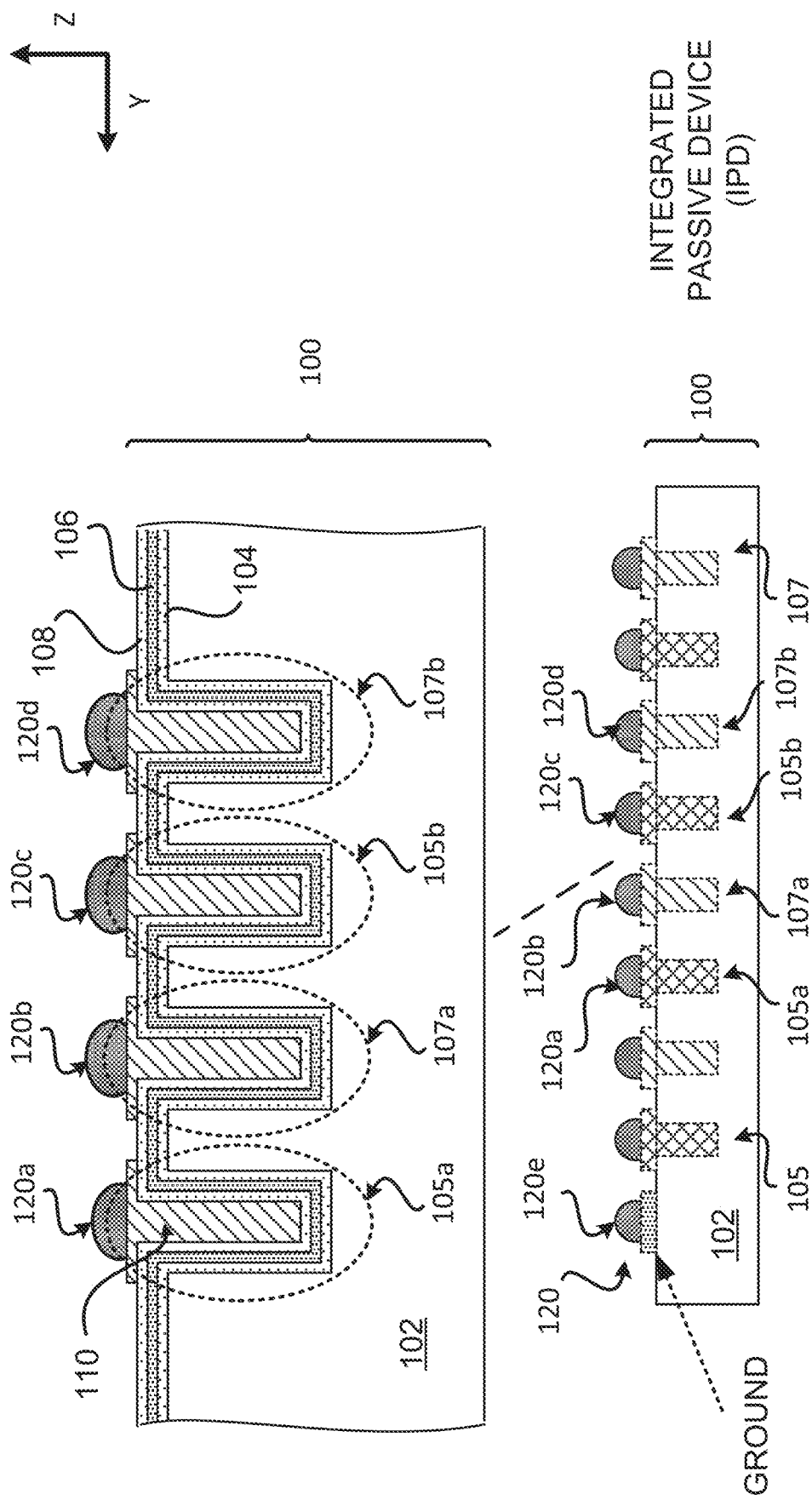
FIG. 1 illustrates a cross sectional profile view of an integrated passive device comprising multi-capacitors.

Exemplary Package Comprising an Integrated Passive Device with Multiple Capacitors FIG. 1 illustrates a cross sectional profile view of an integrated passive device 100 that includes multiple capacitors. The integrated passive device 100 may be configured to operate as two or more capacitors (e.g., trench capacitors). The integrated passive device 100 may be a means for multi-trench capacitance. The integrated passive device 100 includes a passive device substrate 102, a first plurality of trench capacitors 105 and a second plurality of trench capacitors 107. A plurality of solder interconnects 120 may be coupled to the integrated passive device 100. The passive device substrate 102 may include silicon (Si). The passive device substrate 102 may include a plurality of trenches and/or cavities over which capacitors may be formed. Examples of trenches and/or cavities are further described below in at least FIGS. 10A-10C.

The first plurality of trench capacitors 105 includes a trench capacitor 105a and a trench capacitor 105b. The trench capacitor 105a and the trench capacitor 105b may be configured to be part of a same capacitor (e.g., first capacitor, first trench capacitor). The trench capacitor 105a and the trench capacitor 105b may be configured to be coupled to and/or part of a first power distribution network (PDN). The trench capacitor 105a and the trench capacitor 105b may be configured to be part of a first electrical path for a first power for a package. The trench capacitor 105a and the trench capacitor 105b may be configured to be coupled to integrated device(s).

The second plurality of trench capacitors 107 includes a trench capacitor 107a and a trench capacitor 107b. The trench capacitor 107a and the trench capacitor 107b may be configured to be part of a same capacitor (e.g., second capacitor, second trench capacitor). The trench capacitor 107a and the trench capacitor 107b may be configured to be coupled to and/or part of a second power distribution network (PDN). The trench capacitor 107a and the trench capacitor 107b may be configured to be part of a second electrical path for a second power for a package. The trench capacitor 107a and the trench capacitor 107b may be configured to be coupled integrated device(s). Examples of how the integrated passive device 100 is coupled to packages as part of a power distribution network is further described below in at least FIGS. 6-9.

As shown in FIG. 1, the integrated passive device 100 includes the passive device substrate 102, an oxide layer 104, a first electrically conductive layer 106, a dielectric layer 108, and a second electrically conductive layer 110. The first electrically conductive layer 106 and/or the second electrically conductive layer 110 may include polysilicon. The oxide layer 104 and/or the dielectric layer 108 may include $SiO_2$ (e.g., low-pressure chemical vapor deposition (LPCVD) $SiO_2$) or $Si_3N_4$ (e.g., LPCVD $Si_3N_4$). Portions of the oxide layer 104, the first electrically conductive layer 106, the dielectric layer 108, and the second electrically conductive layer 110 may be located in trenches and/or cavities of the passive device substrate 102. It is noted that a passive device substrate 102 may be considered to have a trench or a cavity, even if the trench or the cavity is filled with one or more materials.

The trench capacitor 105a (e.g., first trench capacitor, first capacitor, means for first trench capacitance) may be defined by (i) a first portion of the oxide layer 104, (ii) a first portion of the first electrically conductive layer 106, (iii) a first portion of the dielectric layer 108, and (iv) a first portion of the second electrically conductive layer 110 that are located in a trench (e.g., first trench) of the passive device substrate 102.

The trench capacitor 107a (e.g., second trench capacitor, second capacitor, means for second trench capacitance) may be defined by (i) a second portion of the oxide layer 104, (ii) a second portion of the first electrically conductive layer 106, (iii) a second portion of the dielectric layer 108, and (iv) a second portion of the second electrically conductive layer 110 that are located in a trench (e.g., second trench) of the passive device substrate 102.

The trench capacitor 105b (e.g., third trench capacitor, third capacitor, means for third trench capacitance) may be defined by (i) a third portion of the oxide layer 104, (ii) a third portion of the first electrically conductive layer 106, (iii) a third portion of the dielectric layer 108, and (iv) a third portion of the second electrically conductive layer 110 that are located in a trench (e.g., third trench) of the passive device substrate 102. It is noted that trench capacitor 105b may be part of a same capacitor as the trench capacitor 105a. That is, the trench capacitor 105a and the trench capacitor 105b may be configured to be electrically coupled together to form a capacitor (e.g., first capacitor) with a greater capacitance.

The trench capacitor 107b (e.g., fourth trench capacitor, fourth capacitor, means for fourth trench capacitance) may be defined by (i) a fourth portion of the oxide layer 104, (ii) a fourth portion of the first electrically conductive layer 106, (iii) a fourth portion of the dielectric layer 108, and (iv) a fourth portion of the second electrically conductive layer 110 that are located in a trench (e.g., fourth trench) of the passive device substrate 102. It is noted that trench capacitor 107b may be part of a same capacitor as the trench capacitor 107a. That is, the trench capacitor 107a and the trench capacitor 107b may be configured to be electrically coupled together to form a capacitor (e.g., second capacitor) with a greater capacitance.

FIG. 1 illustrates the plurality of solder interconnects 120 coupled to integrated passive device 100. For example, (i) the solder interconnect 120a is coupled to the second electrically conductive layer 110 of the trench capacitor 105a, (ii) the solder interconnect 120b is coupled to the second electrically conductive layer 110 of the trench capacitor 107a, (iii) the solder interconnect 120c is coupled to the second electrically conductive layer 110 of the trench capacitor 105b, and (iv) the solder interconnect 120d is coupled to the second electrically conductive layer 110 of the trench capacitor 107b. As will be further described below in at least FIG. 3, the solder interconnect 120e is coupled to the first electrically conductive layer 106. The first electrically conductive layer 106 and the solder interconnect 120e are configured to be coupled to ground.

Figure 2:
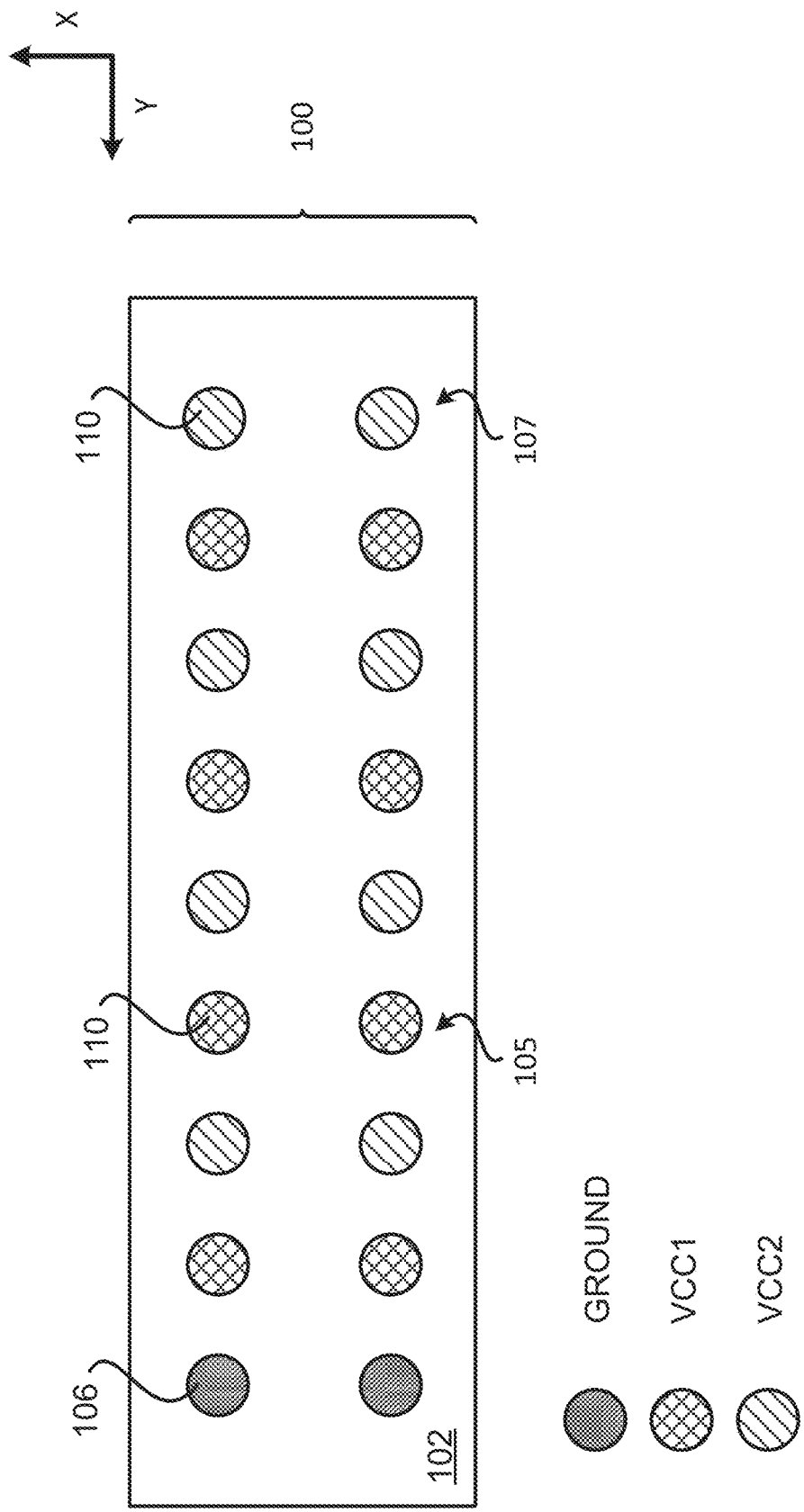
FIG. 2 illustrates a plan view of an integrated passive device comprising multi-capacitors.

FIG. 2 illustrates a plan view of the integrated passive device 100. FIG. 2 illustrates how the various trench capacitors of the integrated passive device 100 may be arranged and/or configured in the integrated passive device 100. As shown in FIG. 2, the trench capacitors may be arranged in alternating columns of trench capacitors 105 and trench capacitor 107, where the trench capacitors 105 are configured to be electrically coupled to a first power and the trench capacitors 107 are configured to be electrically coupled to a second power. FIG. 2 illustrates that different trench capacitors may be coupled to different power (e.g., VCC1, VCC2).

There are several advantages to the integrated passive device 100 with multiple capacitors. First, providing one integrated passive device with multiple capacitor capabilities may mean having to provide less separate integrated passive device. This can result in space savings, as a single integrated passive device will take up less space than two separate and discrete integrated passive devices. Second, providing a single integrated passive device may be more cost effective than providing multiple integrated passive devices. Third, putting multiple capacitors in a single integrated passive device allows the capacitors to be closer to each other, and ultimately allows the capacitors to be closer to integrated devices. This will ultimately provide a package with improved power distribution network performance. In some implementations, the use of a single integrated passive device with multiple capacitors coupled to different power may result in about 15%-35% voltage droop improvement.

Figure 3:
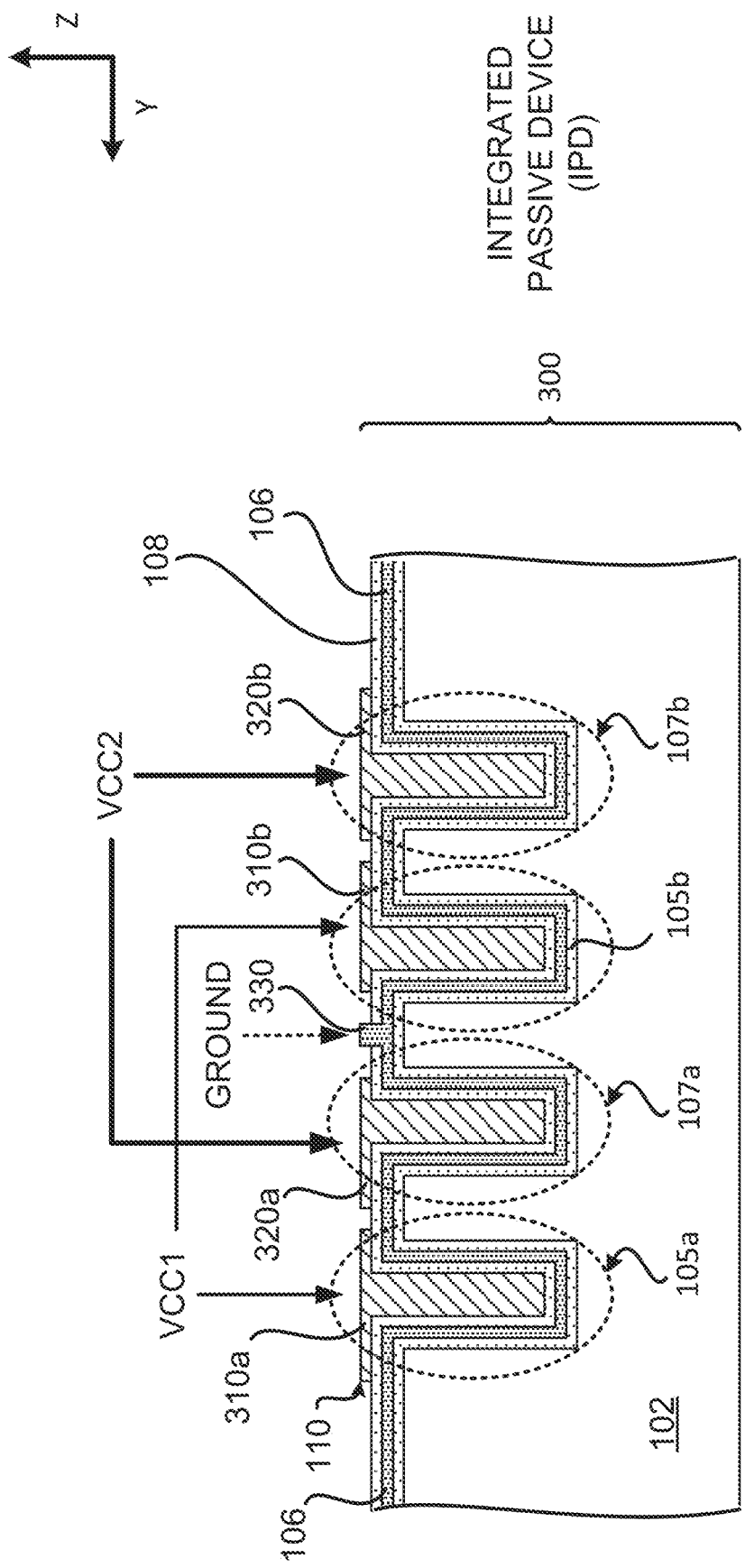
FIG. 3 illustrates a cross sectional profile view of an integrated passive device comprising multi-capacitors.

FIG. 3 illustrates an integrated passive device 300 with multiple capacitors. The integrated passive device 300 may be configured to operate as two or more capacitors. The integrated passive device 300 may be a means for multi-trench capacitance. The integrated passive device 300 includes the passive device substrate 102, the oxide layer 104, the first electrically conductive layer 106, the dielectric layer 108, and the second electrically conductive layer 110. The integrated passive device 300 is similar to the integrated passive device 100. FIG. 3 illustrates how ground and power may be configured to be coupled to an integrated passive device.

As shown in FIG. 3, a portion 310a of the trench capacitor 105a (e.g., portion 310a of the second electrically conductive layer) and a portion 310b of the trench capacitor 105b (e.g., portion 310b of the second electrically conductive layer) may be configured to be electrically coupled to a first power (VCC1). The portion 310a may be a pad of the trench capacitor 105a. The portion 310b may be a pad of the trench capacitor 105b. As further shown in FIG. 3, a portion 320a of the trench capacitor 107a (e.g., portion 320a of the second electrically conductive layer) and a portion 320b of the trench capacitor 107b (e.g., portion 320b of the second electrically conductive layer) may be configured to be electrically coupled to a second power (VCC2). The portion 320a may be a pad of the trench capacitor 107a. The portion 320b may be a pad of the trench capacitor 107b. FIG. 3 illustrates that a portion 330 of the first electrically conductive layer 106 may be configured to be coupled to ground. The portion 330 of the first electrically conductive layer 106 may be a ground pad for the integrated passive device 300. A solder interconnect 120e may be configured to be coupled to the portion 330 of the first electrically conductive layer 106.

Figure 4:
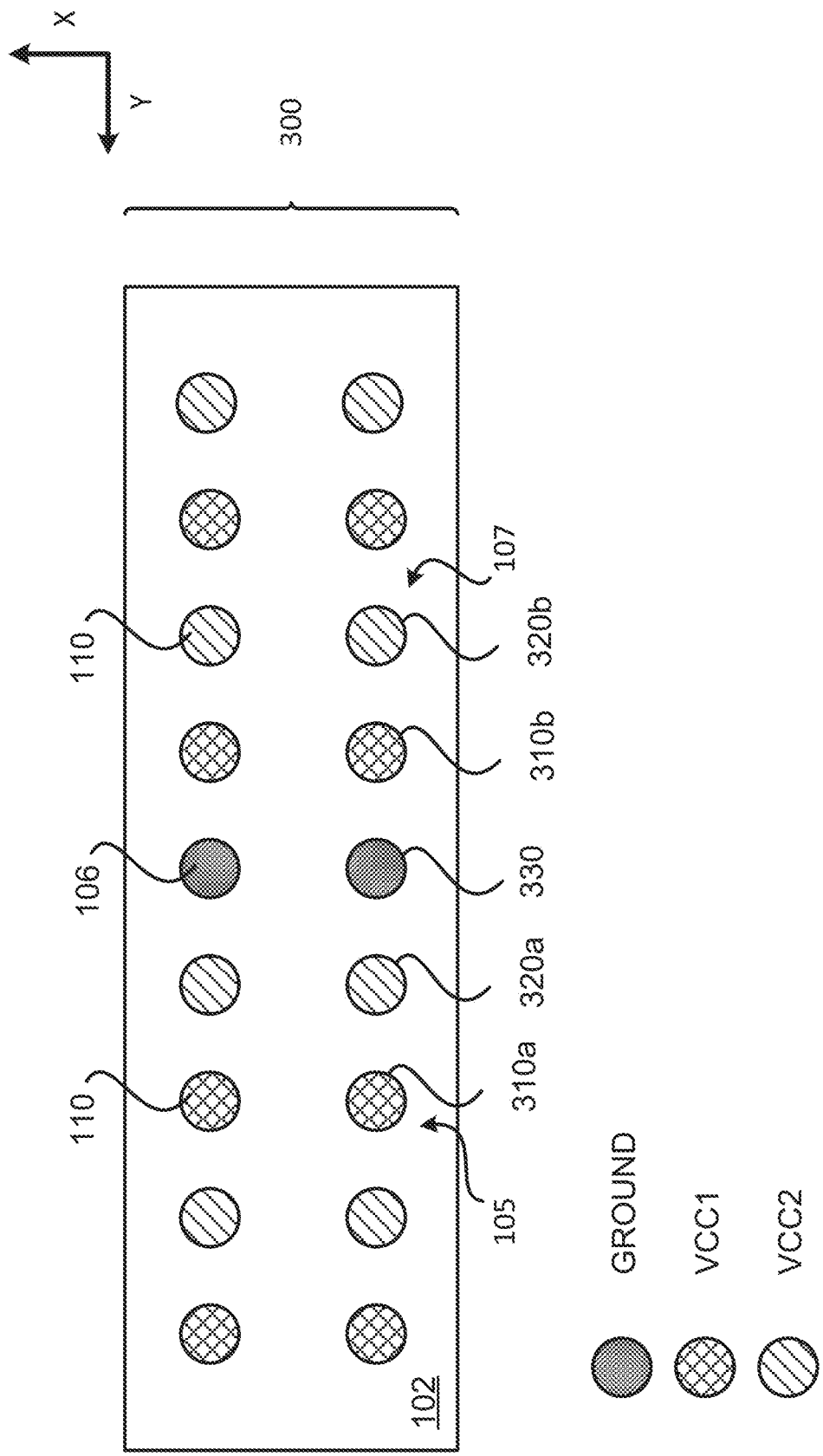
FIG. 4 illustrates a plan view of an integrated passive device comprising multi-capacitors.

FIG. 4 illustrates a plan view of the integrated passive device 300. FIG. 4 illustrates how the various trench capacitors of the integrated passive device 300 may be arranged and/or configured in the integrated passive device 300. As shown in FIG. 4, the trench capacitors may be arranged in alternating columns of trench capacitors 105 and trench capacitor 107, where the trench capacitors 105 are configured to be electrically coupled to a first power and the trench capacitors 107 are configured to be electrically coupled to a second power. A column of electrically conductive layer (e.g., 106) may be located in between columns of trench capacitors.

Figure 5:
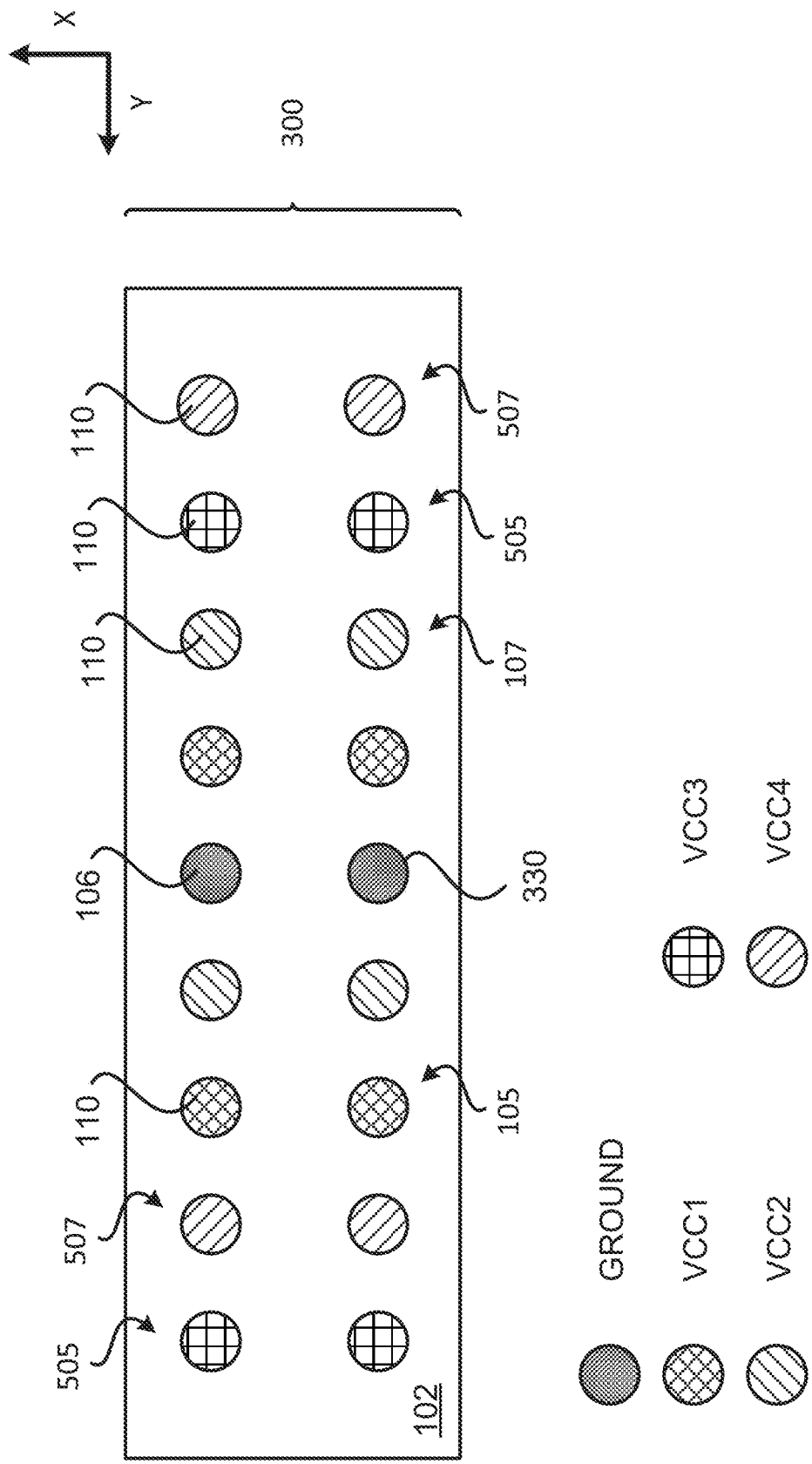
FIG. 5 illustrates a plan view of an integrated passive device comprising multi-capacitors.

FIG. 5 illustrates a plan view of the integrated passive device 300. FIG. 5 illustrates another example of how the various trench capacitors of the integrated passive device 300 may be arranged and/or configured in the integrated passive device 300. As shown in FIG. 5, the integrated passive device 300 includes trench capacitors 105, trench capacitor 107, trench capacitors 505 and trench capacitors 507. The trench capacitors 505 and the trench capacitors 507 may be similar to the trench capacitors 105 and the trench capacitors 107. The trench capacitors 105 are configured to be coupled to a first power (VCC1). The trench capacitors 107 are configured to be coupled to a second power (VCC2). The trench capacitors 505 are configured to be coupled to a third power (VCC3). The trench capacitors 507 are configured to be coupled to a fourth power (VCC4). The first power, the second power, the third power and the fourth power may be part of a power distribution network. The trench capacitors may be arranged in alternating columns of trench capacitors 105, trench capacitor 107, trench capacitors 505 and/or trench capacitors 507. A column of electrically conductive layer (e.g., 106) may be located in between columns of trench capacitors.

In some implementations, a first power may include a current with a first voltage, a second power may include a current with a second voltage, a third power may include a current with a third voltage, and a fourth power may include a current with a fourth voltage. Thus, an integrated passive device (e.g., 100, 300) may be configured to be coupled to power with different voltages. In some implementations, the various power to the trench capacitors may be provided through one or more power management integrated devices. It is noted that the arrangements shown in the disclosure of how the various power (e.g., voltage) are coupled to the capacitors are exemplary. Different implementations may have different arrangements and/or configurations of how various power may be coupled to the various trench capacitors.

Figure 6:
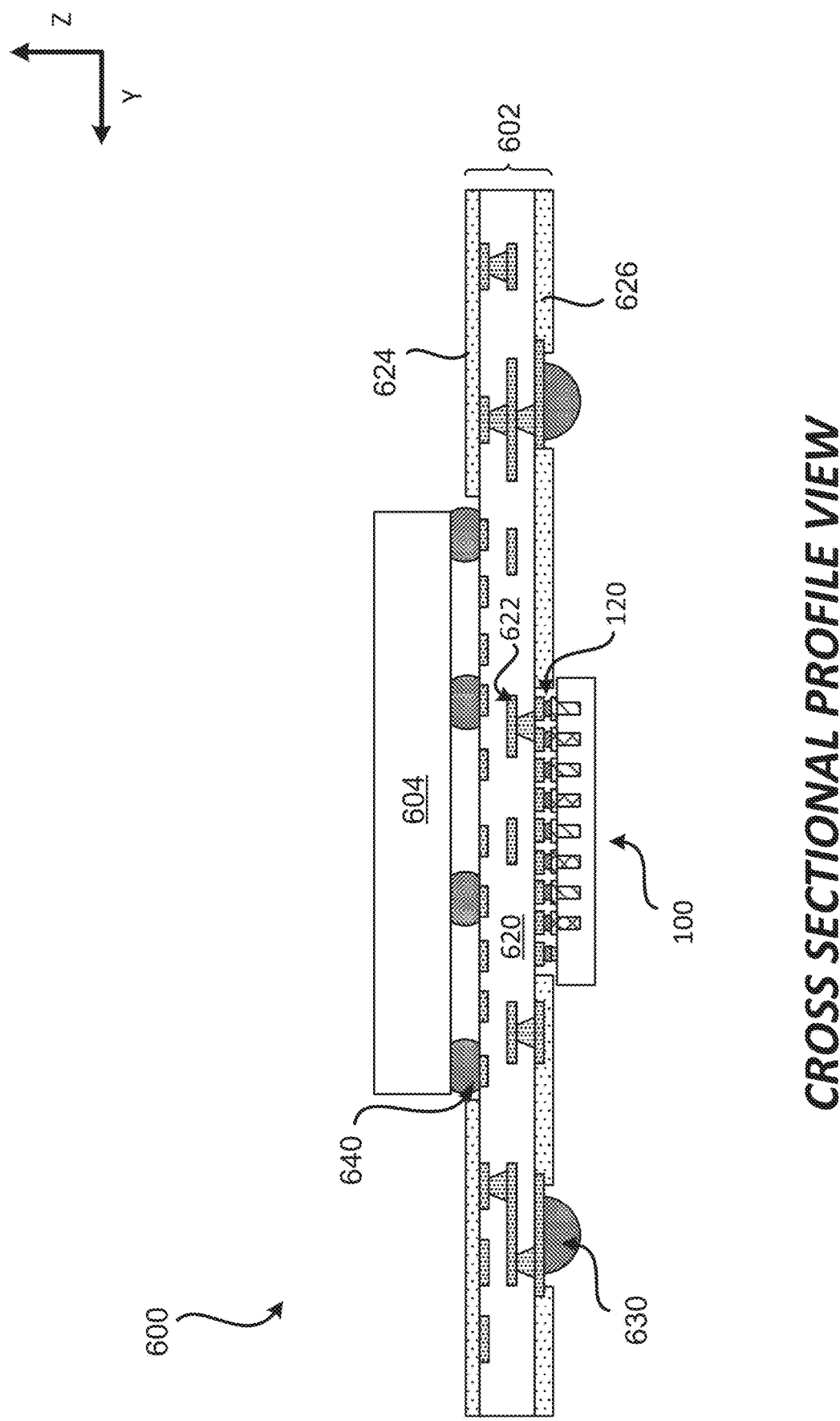
FIG. 6 illustrates a cross sectional profile view of a package that includes a substrate and an integrated passive device comprising multi-capacitors.

FIG. 6 illustrates a package 600 that includes a substrate and an integrated passive device with multiple capacitors.

The package 600 includes a substrate 602, an integrated device 604, the integrated passive device 100. The integrated device 604 is coupled to a first surface (e.g., top surface) of the substrate 602 through a plurality of solder interconnects 640. The integrated passive device 100 is coupled to a second surface (e.g., bottom surface) of the substrate 602 through the plurality of solder interconnects 120. The substrate 602 includes at least one dielectric layer 620, a plurality of interconnects 622, a solder resist layer 624, and a solder resist layer 626. A plurality of solder interconnects 630 may be coupled to the substrate 602. The integrated passive device 100 is configured to be electrically coupled to the integrated device 604 through the substrate 602. As shown in FIG. 6, the capacitors of the integrated passive device 100 are located closer (e.g., vertically closer) to the integrated device 604. Moreover, using one integrated passive device (e.g., configured to operate as several capacitors) instead of multiple integrated passive devices takes up less space in the package 600.

The package 600 may include a power distribution network (PDN) that is configured to be coupled to the integrated device 604 and the integrated passive device 100. The PDN may be coupled to a power management integrated device. A first power from the PDN may be coupled to first capacitor(s) from the integrated passive device 100, a first plurality of interconnects from the plurality of interconnects 622, and the integrated device 604. A second power from the PDN may be coupled to second capacitor(s) from the integrated passive device 100, a second plurality of interconnects from the plurality of interconnects 622, and the integrated device 604. Interconnects from the plurality of interconnects 622 that are configured to provide an electrical path for power may include power rails and/or power stripes.

Figure 7:
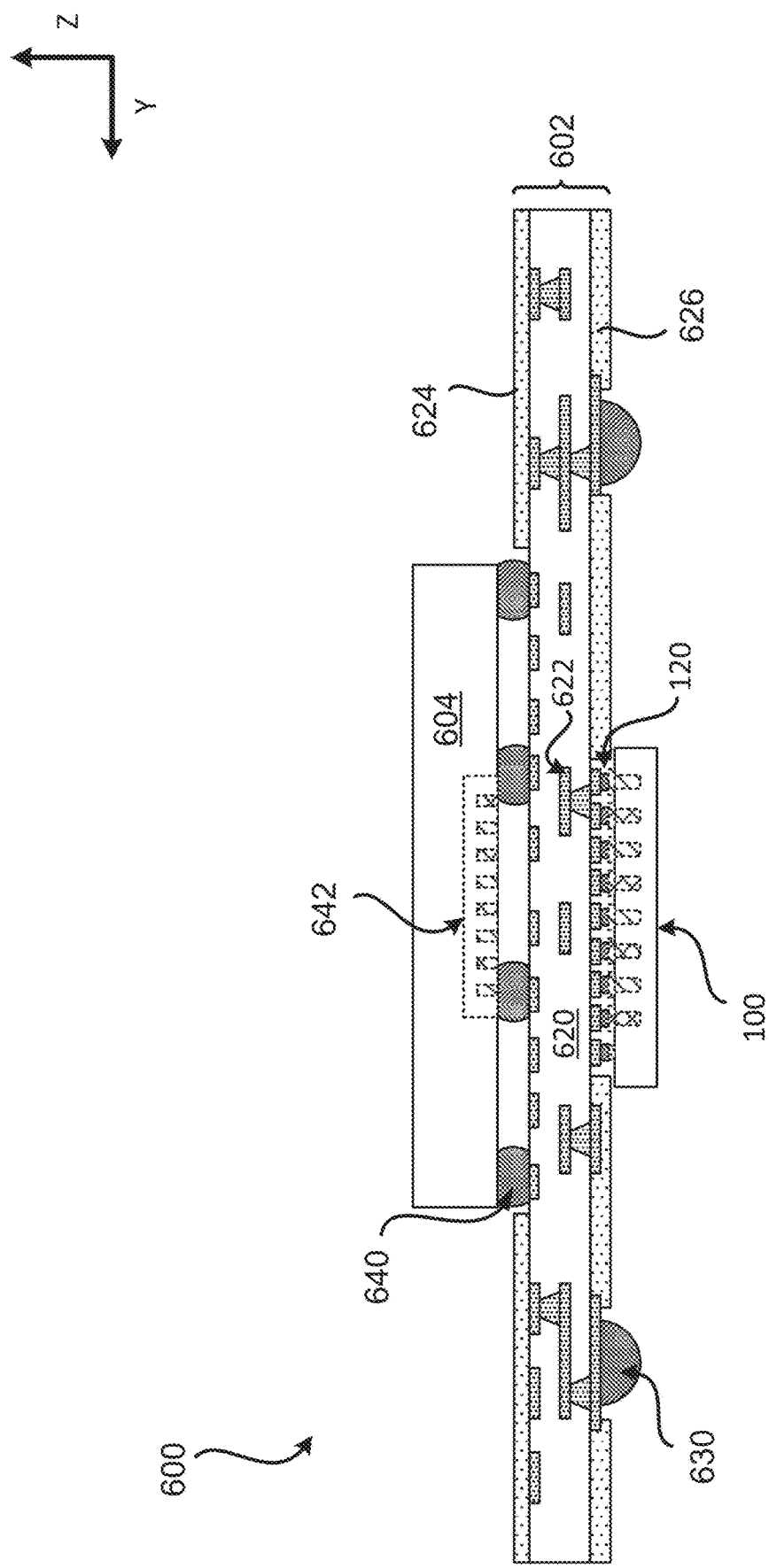
FIG. 7 illustrates a cross sectional profile view of a package that includes a substrate and an integrated passive device comprising multi-capacitors.

FIG. 7 illustrates the package 600 that includes the integrated device 604, where the integrated device 604 includes an internal integrated passive device 642. The internal integrated passive device 642 may be implemented next to transistors of the integrated device 604. The integrated passive device 642 may be fabricated along with the transistors of the integrated device 604. The internal integrated passive device 642 may be implemented in the die substrate of the integrated device 604. The internal integrated passive device 642 may represent a circuitry (e.g., functional circuitry) and/or a circuit block (e.g., functional block) in the integrated device 604. The internal integrated passive device 642 is not necessarily a discrete integrated passive device (e.g., a separate integrated passive device that is fabricated and placed in the integrated device). The internal integrated passive device 642 may be configured to be coupled to one or more internal memory (not shown) of the integrated device 604 and/or one or more external memory (e.g., memory die). In some implementations, a first power from the PDN may be coupled to first capacitor(s) from the integrated passive device 100, a first plurality of interconnects from the plurality of interconnects 622, and the internal integrated passive device 642 of the integrated device 604. In some implementations, a second power from the PDN may be coupled to second capacitor(s) from the integrated passive device 100, a second plurality of interconnects from the plurality of interconnects 622, and the internal integrated passive device 642 of the integrated device 604.

Figure 8:
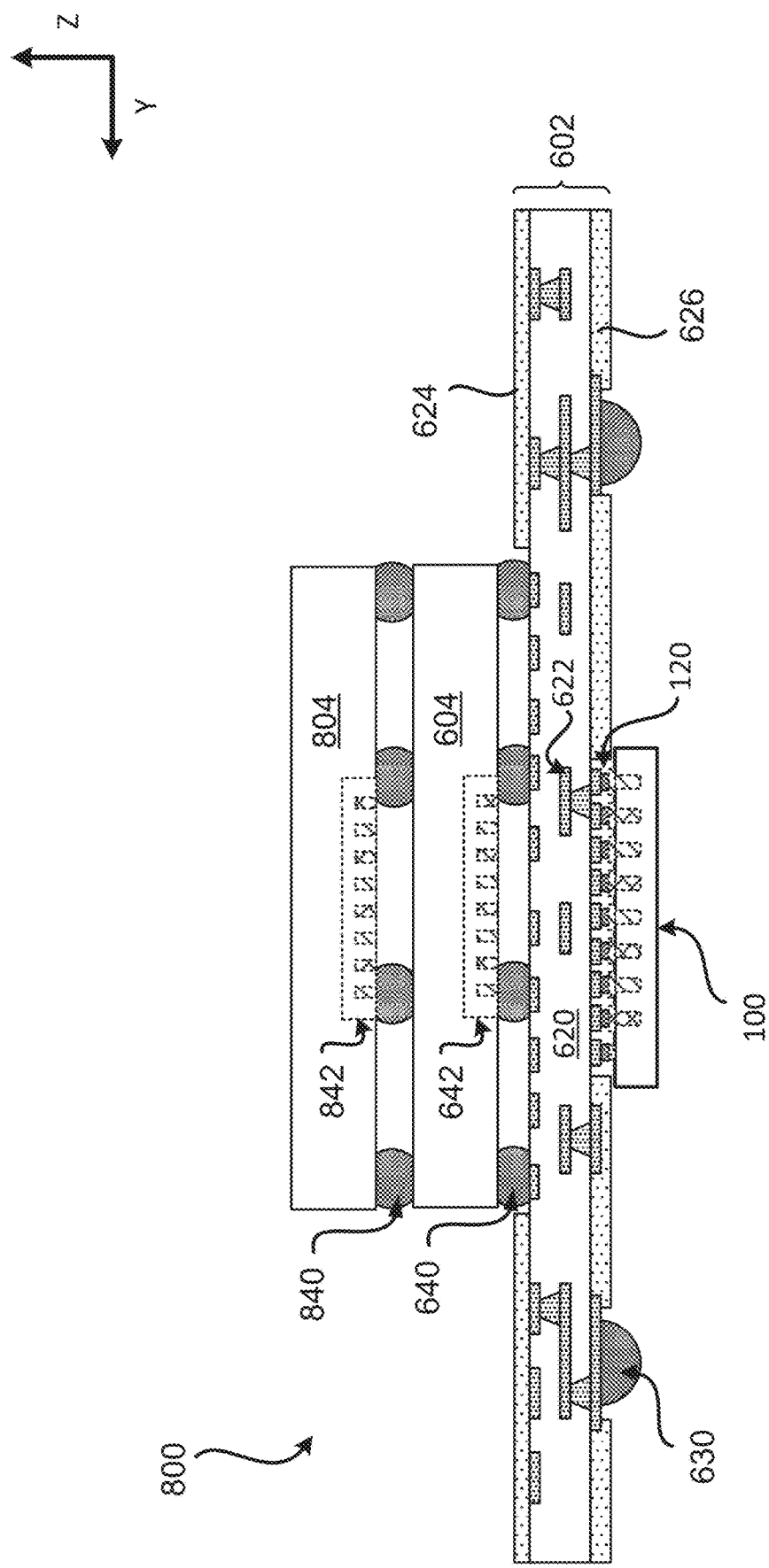
FIG. 8 illustrates a cross sectional profile view of a package that includes a substrate and an integrated passive device comprising multi-capacitors.

FIG. 8 illustrates a package 800 that includes several integrated devices. The package 800 is similar to the package 600, and thus includes the same or similar components as the package 600. The package 800 includes a second integrated device 804. The package 800 includes the substrate 602, the integrated device 604, the integrated device 804 and the integrated passive device 100. The second integrated device 804 is coupled to the integrated device 604 through a plurality of solder interconnects 840. The integrated device 804 includes an internal integrated passive device 842. The internal integrated passive device 842 may be implemented next to transistors of the integrated device 804. The integrated passive device 842 may be fabricated along with the transistors of the integrated device 804. The internal integrated passive device 842 may be implemented in the die substrate of the integrated device 804. The internal integrated passive device 842 may represent a circuitry (e.g., functional circuitry) and/or a circuit block (e.g., functional block) in the integrated device 804. The internal integrated passive device 842 is not necessarily a discrete integrated passive device (e.g., a separate integrated passive device that is fabricated and placed in the integrated device). The internal integrated passive device 842 may be configured to be coupled to one or more internal memory (not shown) of the integrated device 804 and/or one or more external memory (e.g., memory die).

The package 800 may include a power distribution network (PDN) that is configured to be coupled to the integrated device 604, the integrated device 804 and the integrated passive device 100. A power distribution network may be coupled to a power management integrated device. A first power from the PDN may be coupled to first capacitor(s) from the integrated passive device 100, a first plurality of interconnects from the plurality of interconnects 622, and the internal integrated passive device 642 of integrated device 604. A second power from the PDN may be coupled to second capacitor(s) from the integrated passive device 100, a second plurality of interconnects from the plurality of interconnects 622, the integrated device 604, and the internal integrated passive device 842 of the integrated device 804.

FIG. 9 illustrates the package 800. The package 800 of FIG. 9 illustrates that (i) the integrated device 604 includes a processor unit 644 and a memory unit 646, and (ii) the integrated device 804 includes a processor unit 844 and a memory unit 846. The integrated device 604 may include the internal integrated passive device 642. The integrated device 804 may include the internal integrated passive device 842.

The processor unit 644 and/or the memory unit 646 are not necessarily discrete devices from the integrated device 604. The processor unit 644 may be a circuitry (e.g., functional circuitry) and/or a circuit block (e.g., functional block) of the integrated device 604. The memory unit 646 may be a circuitry (e.g., functional circuitry) and/or a circuit block (e.g., functional block) of the integrated device 604.

The processor unit 844 and/or the memory unit 846 are not necessarily discrete devices from the integrated device 804. The processor unit 844 may be a circuitry (e.g., functional circuitry) and/or a circuit block (e.g., functional block) of the integrated device 804. The memory unit 846 may be a circuitry (e.g., functional circuitry) and/or a circuit block (e.g., functional block) of the integrated device 804. In some implementations, the integrated device 804 may be coupled to the substrate 602 and is located laterally next to the integrated device 604.

In some implementations, a first power from the PDN may be coupled to first capacitor(s) from the integrated passive device 100, a first plurality of interconnects from the plurality of interconnects 622, and the processor unit 644 of integrated device 604. In some implementations, a second power from the PDN may be coupled to second capacitor(s) from the integrated passive device 100, a second plurality of interconnects from the plurality of interconnects 622, the memory unit 646 of the integrated device 604.

In some implementations, a third power from the PDN may be coupled to third capacitor(s) from the integrated passive device 100, a third plurality of interconnects from the plurality of interconnects 622, and the processor unit 844 of integrated device 804. In some implementations, a fourth power from the PDN may be coupled to fourth capacitor(s) from the integrated passive device 100, a fourth plurality of interconnects from the plurality of interconnects 622, the memory unit 846 of the integrated device 804.

In some implementations, the first power may be from a first power distribution network, the second power may be from a second power distribution network, the third power may be from a third power distribution network, and fourth power may be from a fourth power distribution network. The first power distribution network, the second power distribution network, the third power distribution network and the fourth distribution network may be part of a power distribution network (e.g., single power distribution network).

It is noted that the packages 600 and 800 includes the integrated passive device 100. However, in some implementations, the packages 600 and/or 800 may include other integrated passive devices (e.g., 300) with different configurations.

An integrated device (e.g., 604, 804) may include a die (e.g., semiconductor bare die). The integrated device may include a power management integrated circuit (PMIC). The integrated device may include an application processor. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 604) may include at least one electronic circuit (e.g., first electronic circuit, second electronic circuit, etc. . . . ).

The orientation of the internal integrated passive device (e.g., 642, 842) shown in the integrated device is exemplary. Different implementations may form and/or position the internal integrated passive device inside the integrated device differently. It is noted that the integrated devices (e.g., 604, 804, may face a substrate differently). For example, a front side of the integrated device 604 may face the substrate 602. A front side of the integrated device 804 may face a back side of the integrated device 604. Different implementations may use different substrates. The substrates (e.g., 602) may include an embedded trace substrate (ETS). Examples of substrates that may be used include a laminated substrate and/or a cored substrate. The substrate may have different numbers of metal layers (e.g., 10 metal layers). The at least one dielectric layer 620 may include prepreg. An example of fabricating a substrate is further described below in FIGS. 14A-14B. It is also noted that different packages may have different integrated passive devices with different designs and/or configuration. Thus, the packages described are not limited to the integrated passive device 100 described in the disclosure. In some implementations, one or more package may include the integrated passive device 300.

Figure 10B:
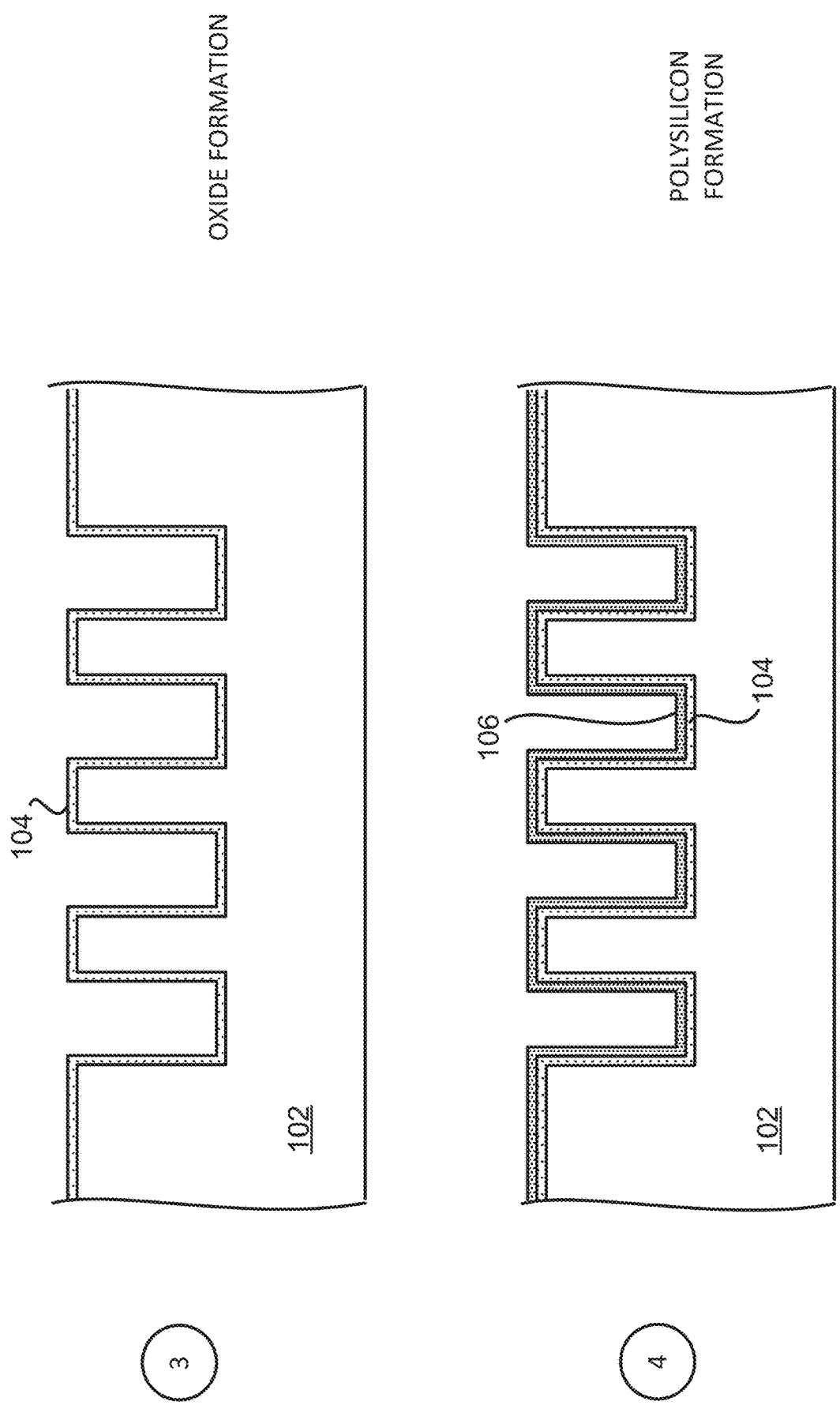

Exemplary Sequence for Fabricating an Integrated Passive Device with Multiple Capacitors In some implementations, fabricating ab integrated passive device includes several processes. FIGS. 10A-10C illustrate an exemplary sequence for providing or fabricating an integrated passive device. In some implementations, the sequence of FIGS. 10A-10C may be used to provide or fabricate the integrated passive devices 300 of FIG. 3. However, the process of FIGS. 10A-10C may be used to fabricate any of the integrated passive devices (e.g., 100) described in the disclosure.

It should be noted that the sequence of FIGS. 10A-10C may combine one or more stages in order to simplify and/or clarify the sequence for providing or fabricating an integrated passive device. In some implementations, the order of the processes may be changed or modified. In some implementations, one or more of processes may be replaced or substituted without departing from the scope of the disclosure.

Stage 1, as shown in FIG. 10A, illustrates a state after a substrate 102 is provided. The substrate 102 may be a passive device substrate. The substrate 102 may include silicon (Si).

Stage 2 illustrates a state after a plurality of trenches 1000 is formed in the substrate 102. The plurality of trenches 1000 may include a plurality of cavities. The plurality of trenches 1000 may include a first trench, a second trench, a third trench, and a fourth trench. The trenches may have different shapes and/or different depths. An etching process may be used to form the plurality of trenches. The plurality of trenches 1000 may be evenly spaced or have different spacing. For example, the spacing between neighboring trenches may be about 7 micrometers.

Stage 3, as shown in FIG. 10B, illustrates a state after an oxide layer 104 is formed over a surface of the substrate 102. A deposition process may be used to form the oxide layer 104 over the surface of the substrate 102 including over and in the plurality of trenches 1000. For example, a chemical vapor deposition (CVD) process may be used to form the oxide layer 104. A low-pressure chemical vapor deposition (LPCVD) process may be used to form the oxide layer 104. The oxide layer 104 may take up the shape and/or contour of the plurality of trenches 1000.

Stage 4 illustrates a state after a first electrically conductive layer 106 is formed over the oxide layer 104. The first electrically conductive layer 106 may include polysilicon. A deposition process may be used to form the first electrically conductive layer 106 over the oxide layer 104 including over and in the plurality of trenches 1000. For example, a chemical vapor deposition (CVD) process may be used to form the first electrically conductive layer 106. A low-pressure chemical vapor deposition (LPCVD) process may be used to form the first electrically conductive layer 106. The first electrically conductive layer 106 may take up the shape and/or the contour of the oxide layer 104 and/or the plurality of trenches 1000. The first electrically conductive layer 106 may include polysilicon. The first electrically conductive layer 106 may be doped. An example of a dopant includes boron. Thus, for example, the first electrically conductive layer 106 may include a LPCVD polysilicon doped with boron.

Stage 5 illustrates a state after a dielectric layer 108 is formed over the first electrically conductive layer 106. A deposition process and/or a lamination process may be used to form the dielectric layer 108 over the first electrically conductive layer 106 including over and in the plurality of trenches 1000.

Stage 6 illustrates a state after a second electrically conductive layer 110 is formed over the dielectric layer 108. The second electrically conductive layer 110 may include polysilicon. A deposition process may be used to form the second electrically conductive layer 110 over the dielectric layer 108 including over and in the plurality of trenches 1000. For example, a chemical vapor deposition (CVD) process may be used to form the second electrically conductive layer 110. A low-pressure chemical vapor deposition (LPCVD) process may be used to form the second electrically conductive layer 110. An etching process may be used to form the various portions of the second electrically conductive layer 110. The second electrically conductive layer 110 may fill up the plurality of trenches 1000. The second electrically conductive layer 110 may be doped. An example of a dopant includes boron. Thus, for example, the second electrically conductive layer 110 may include a LPCVD polysilicon doped with boron. Stage 6 may also illustrate where additional portion(s) of the first electrically conductive layer 106 may be formed. The additional portion(s) of the first electrically conductive layer 106 may be formed through opening(s) of the dielectric layer 108. The additional portion(s) of the first electrically conductive layer 106 that is not covered by the dielectric layer 108 may be used as a pad to be coupled to a solder interconnect. The additional portion of the first electrically conductive layer 106 may be formed using a deposition process. The first electrically conductive layer 106 and/or the second electrically conductive layer 108 may include polysilicon. Stage 6 illustrates an example of the integrated passive device 300 that includes a first plurality of trench capacitors 105 and a second plurality of trench capacitors 107.

Figure 11:
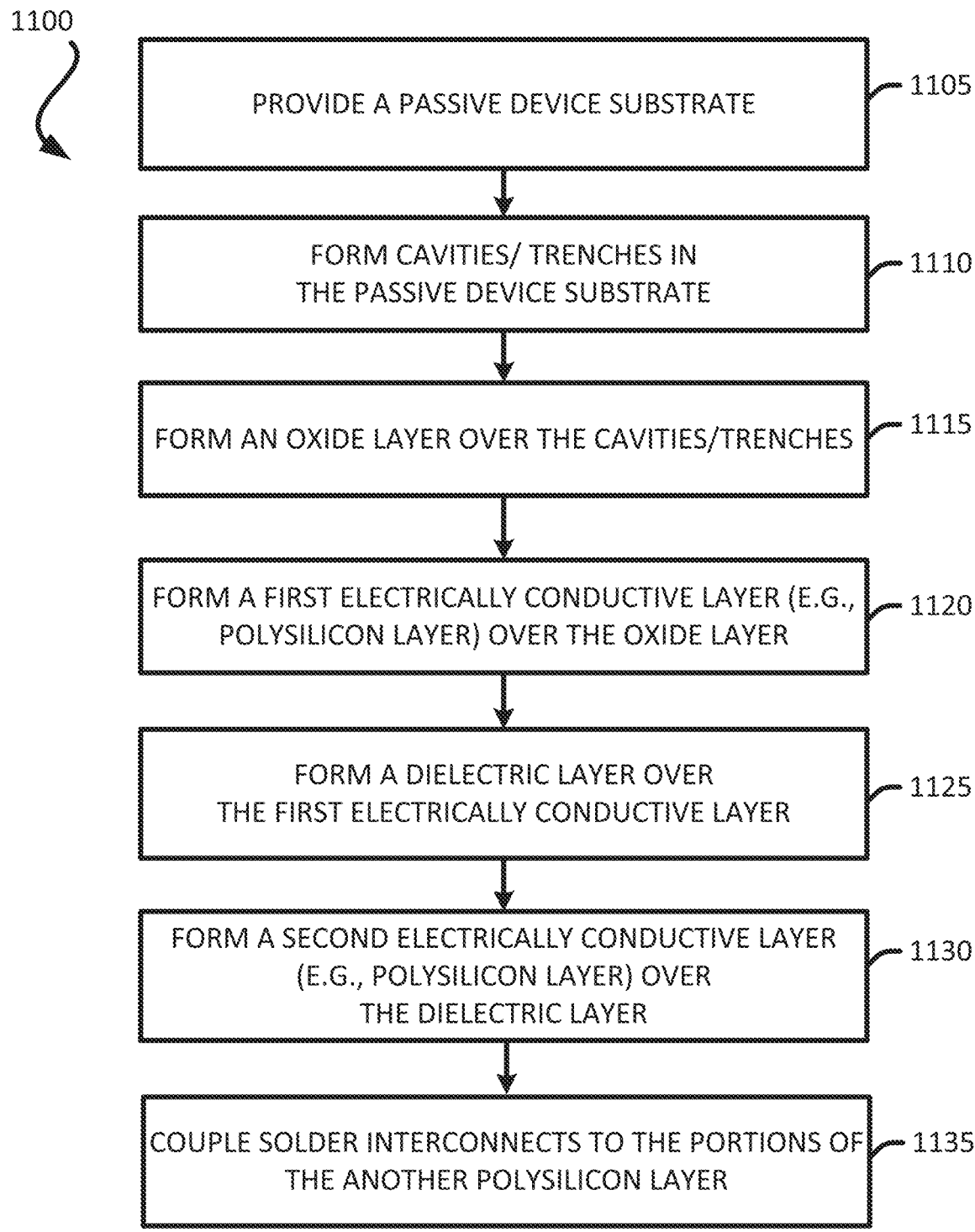
FIG. 11 illustrates an exemplary flow diagram of a method for fabricating an integrated passive device comprising multi-capacitors.

Exemplary Flow Diagram of a Method for Fabricating an Integrated Passive Device with Multiple Capacitors In some implementations, fabricating an integrated passive device includes several processes. FIG. 11 illustrates an exemplary flow diagram of a method 1100 for providing or fabricating an integrated passive device. In some implementations, the method 1100 of FIG. 11 may be used to provide or fabricate the integrated passive device 300 of FIG. 3. However, the method 1100 may be used to fabricate any integrated passive device with multiple capacitors. The method 1100 of FIG. 11 will be used to describe fabricating the integrated passive device 300.

It should be noted that the method of FIG. 11 may combine one or more processes in order to simplify and/or clarify the method for providing or fabricating an integrated passive device. In some implementations, the order of the processes may be changed or modified.

The method provides (at 1105) a substrate (e.g., 102). The substrate 102 may be a passive device substrate. The substrate 102 may include silicon (Si). Stage 1 of FIG. 10A illustrates and describes an example of providing a passive device substrate.

The method forms (at 1110) a plurality of trenches (e.g., 1000) in the substrate (e.g., 102). The plurality of trenches 1000 may include a plurality of cavities. The plurality of trenches 1000 may include a first trench, a second trench, a third trench, and a fourth trench. The trenches may have different shapes and/or different depths. An etching process may be used to form the plurality of trenches 1000. The plurality of trenches 1000 may be evenly spaced or have different spacing. Stage 2 of FIG. 10A illustrates and describes an example of forming trenches.

The method forms (at 1115) an oxide layer (e.g., 104) over the plurality of trenches. The oxide layer 104 may be formed over a surface of the substrate 102. A deposition process may be used to form the oxide layer 104 over the surface of the substrate 102 including over and in the plurality of trenches 1000. A low-pressure chemical vapor deposition (LPCVD) process may be used to form the oxide layer 104. The oxide layer 104 may take up the shape and/or contour of the plurality of trenches 1000. Stage 3 of FIG. 10B illustrates and describes an example of forming an oxide layer.

The method forms (at 1120) a first electrically conductive layer (e.g., 106) over an oxide layer (e.g., 104). The first electrically conductive layer 106 may be formed over the oxide layer 104. The first electrically conductive layer 106 may include polysilicon. A deposition process may be used to form the first electrically conductive layer 106 over the oxide layer 104 including over and in the plurality of trenches 1000. For example, a low-pressure chemical vapor deposition (LPCVD) process may be used to form the first electrically conductive layer 106. The first electrically conductive layer 106 may take up the shape and/or the contour of the oxide layer 104 and/or the plurality of trenches 1000. Forming the first electrically conductive layer 106 may include doping the first electrically conductive layer 106 with a dopant. Stage 4 of FIG. 10B illustrates and describes an example of forming a first electrically conductive layer.

The method forms (at 1125) a dielectric layer (e.g., 108) over the first electrically conductive layer (e.g., 106). A deposition process may be used to form the dielectric layer 108 over the first electrically conductive layer 106 including over and in the plurality of trenches 1000. Stage 5 of FIG. 10C illustrates and describes an example of forming a dielectric layer.

The method forms (at 1130) a second electrically conductive layer (e.g., 110) over the dielectric layer (e.g., 108). The second electrically conductive layer 110 may include polysilicon. A deposition process may be used to form the second electrically conductive layer 110 over the dielectric layer 108 including over and in the plurality of trenches 1000. A low-pressure chemical vapor deposition (LPCVD) process may be used to form the second electrically conductive layer 110. The second electrically conductive layer 110 may fill up the plurality of trenches 1000. In some implementations, additional portion(s) of the first electrically conductive layer 106 may also be formed (at 1130). The additional portion(s) of the first electrically conductive layer 106 may be formed through opening(s) of the dielectric layer 108. The additional portion of the first electrically conductive layer 106 may be used as pad(s) configured to be coupled to solder interconnects.

The method couples (at 1135) a plurality of solder interconnects (e.g., 120) to the integrated passive device. Coupling the plurality of solder interconnects 120 may include coupling solder interconnects to different portions of the second electrically conductive layer 110, as shown in FIG. 1.

Figure 12:
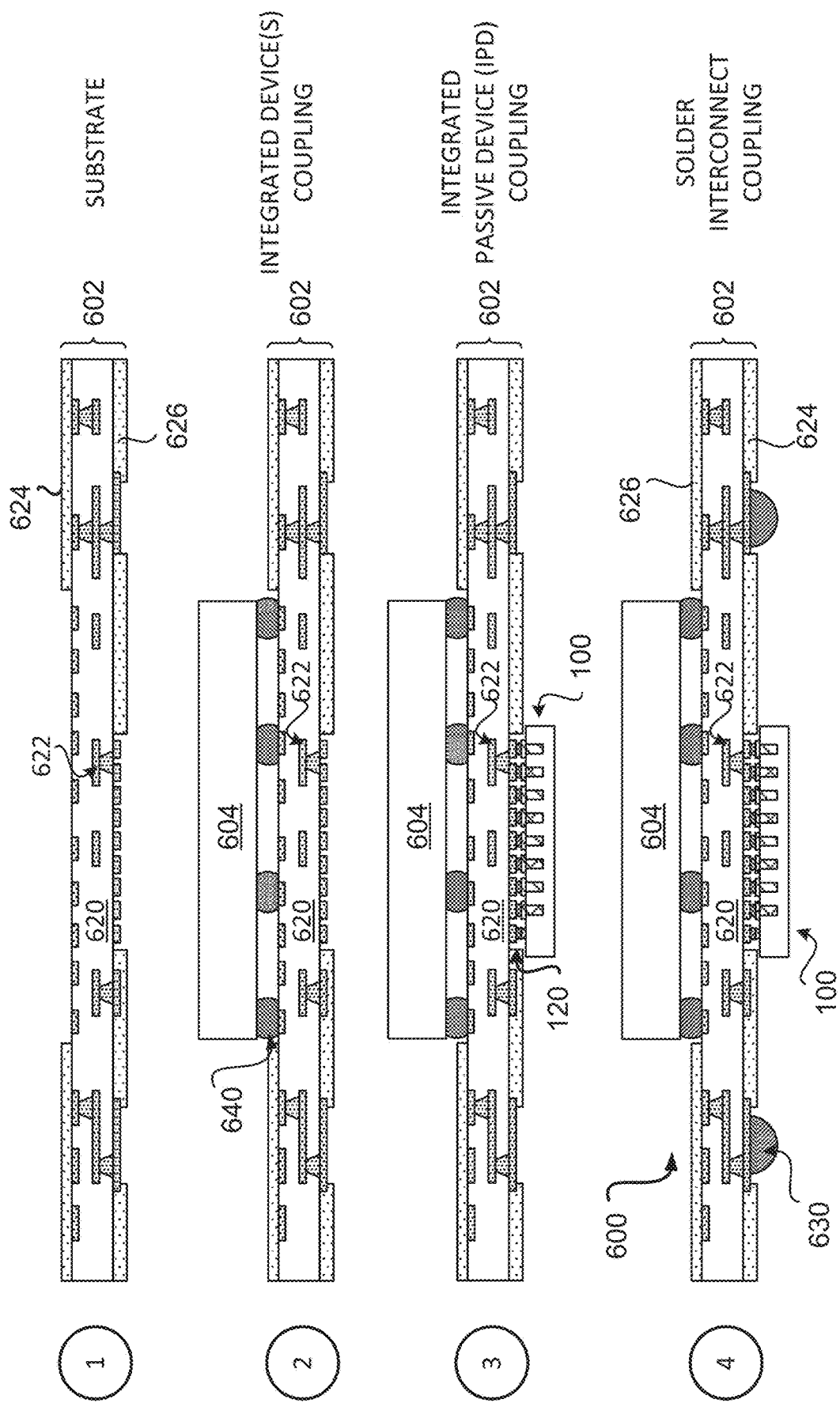
FIG. 12 illustrates an exemplary sequence for fabricating a package that includes a substrate and an integrated passive device comprising multi-capacitors.

Exemplary Sequence for Fabricating a Package that Includes an Integrated Passive Device with Multiple Capacitors FIG. 12 illustrates an exemplary sequence for providing or fabricating a package that includes a substrate and an integrated passive device with multiple capacitors. In some implementations, the sequence of FIG. 12 may be used to provide or fabricate the package 600 of FIG. 6, or any of the packages (e.g., 800) described in the disclosure.

It should be noted that the sequence of FIG. 12 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 12 may be used to fabricate one package or several packages at a time (as part of a wafer).

Stage 1, as shown in FIG. 12, illustrates a state after the substrate 602 is provided. The substrate 602 may be provided by a supplier or fabricated. A process similar to the process shown in FIGS. 14A-14B may be used to fabricate the substrate 602. However, different implementations may use different processes to fabricate the substrate 602. Examples of processes that may be used to fabricate the substrate 602 include a semi-additive process (SAP) and a modified semi-additive process (mSAP). The substrate 602 includes at least one dielectric layer 620, a plurality of interconnects 622, a solder resist layer 624 and a solder resist layer 626. The substrate 602 may include an embedded trace substrate (ETS). In some implementations, the at least one dielectric layer 620 may include prepreg layers.

Stage 2 illustrates a state after the integrated device 604 is coupled to a first surface (e.g., top surface) of the substrate 602. The integrated device 604 may be coupled to the substrate 602 through a plurality of solder interconnects 640. In some implementations, the integrated device 604 may be coupled to the substrate 602 through a plurality of pillar interconnects (not shown) and the plurality of solder interconnects 640. A solder reflow process may be used to couple the integrated device 604 to the substrate 602 through the plurality of solder interconnects 640.

Stage 3 illustrates a state after the integrated passive device 100 is coupled to a second surface (e.g., bottom surface) of the substrate 602. The integrated passive device 100 may be coupled to the substrate 602 through a plurality of solder interconnects 120. A solder reflow process may be used to couple the integrated passive device 100 to the substrate 602 through the plurality of solder interconnects 120. The integrated passive device 100 may be configured to operate as two or more capacitors (e.g., two or more trench capacitors).

Stage 4 illustrates a state after a plurality of solder interconnects 630 is coupled to the substrate 602. The plurality of solder interconnects 630 may be couple to interconnects (e.g., 622) that are located over a second surface of the at least one dielectric layer 620. A solder reflow process may be used to couple the plurality of solder interconnects 630 to the substrate 602. Stage 4 may illustrate the package 600. The packages (e.g., 600) described in the disclosure may be fabricated one at a time or may be fabricated together as part of one or more wafers and then singulated into individual packages.

Figure 13:
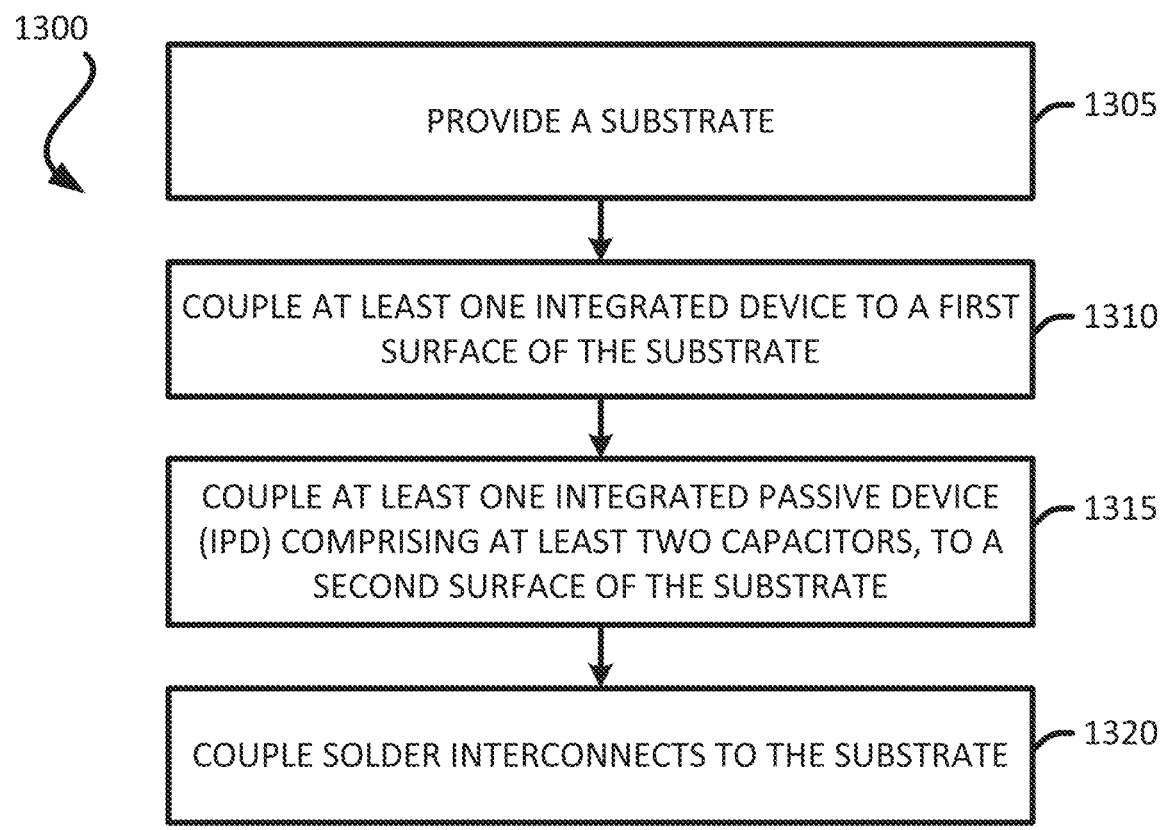
FIG. 13 illustrates an exemplary flow diagram of a method for fabricating a package that includes a substrate and an integrated passive device comprising multi-capacitors.

Exemplary Flow Diagram of a Method for Fabricating a Package that Includes an Integrated Passive Device with Multiple Capacitors In some implementations, fabricating a package that includes a substrate and an integrated passive device includes several processes. FIG. 13 illustrates an exemplary flow diagram of a method 1300 for providing or fabricating a package that includes a substrate and an integrated passive device. In some implementations, the method 1300 of FIG. 13 may be used to provide or fabricate the package 600 of FIG. 6 described in the disclosure. However, the method 1300 may be used to provide or fabricate any of the packages (e.g., 800) described in the disclosure.

It should be noted that the method of FIG. 13 may combine one or more processes in order to simplify and/or clarify the method for providing or fabricating a package that includes a substrate and an integrated passive device. In some implementations, the order of the processes may be changed or modified.

The method provides (at 1305) a substrate (e.g., 602). The substrate 602 may be provided by a supplier or fabricated. A process similar to the process shown in FIGS. 14A-14B may be used to fabricate the substrate 602. However, different implementations may use different processes to fabricate the substrate 602. Examples of processes that may be used to fabricate the substrate 602 include a semi-additive process (SAP) and a modified semi-additive process (mSAP). The substrate 602 includes at least one dielectric layer 620, a plurality of interconnects 622, a solder resist layer 624 and a solder resist layer 626. The substrate 602 may include an embedded trace substrate (ETS). In some implementations, the at least one dielectric layer 620 may include prepreg layers. Stage 1 of FIG. 12 illustrates and describes an example of providing a substrate.

The method couples (at 1310) at least one integrated device to the substrate. For example, the integrated device 604 is coupled to a first surface (e.g., top surface) of the substrate 602. The integrated device 604 may be coupled to the substrate 602 through a plurality of solder interconnects 640. In some implementations, the integrated device 604 may be coupled to the substrate 602 through a plurality of pillar interconnects and the plurality of solder interconnects 640. A solder reflow process may be used to couple the integrated device 604 to the substrate 602 through the plurality of solder interconnects 640. Stage 2 of FIG. 12 illustrates and describes an example of coupling at least one integrated device to a substrate.

The method couples (at 1315) an integrated passive device (e.g., 100) to the substrate (e.g., 602) For example, the integrated passive device 100 is coupled to a second surface (e.g., bottom surface) of the substrate 602. The integrated passive device 100 may be coupled to the substrate 602 through a plurality of solder interconnects 120. A solder reflow process may be used to couple the integrated passive device 100 to the substrate 602 through the plurality of solder interconnects 120. Stage 3 of FIG. 12 illustrates and describes an example of coupling an integrated passive device to a substrate.

The method couples (at 1320) a plurality of solder interconnects (e.g., 630) to the second surface of the substrate (e.g., 602). The plurality of solder interconnects 630 may be couple to interconnects (e.g., 622) that are located over a second surface of the at least one dielectric layer 620. A solder reflow process may be used to couple the plurality of solder interconnects 630 to the substrate 602. Stage 4 of FIG. 12 may illustrate and describes an example of coupling solder interconnects to a package. The packages (e.g., 600) described in the disclosure may be fabricated one at a time or may be fabricated together as part of one or more wafers and then singulated into individual packages.

Exemplary Sequence for Fabricating a Substrate

Figure 14A:
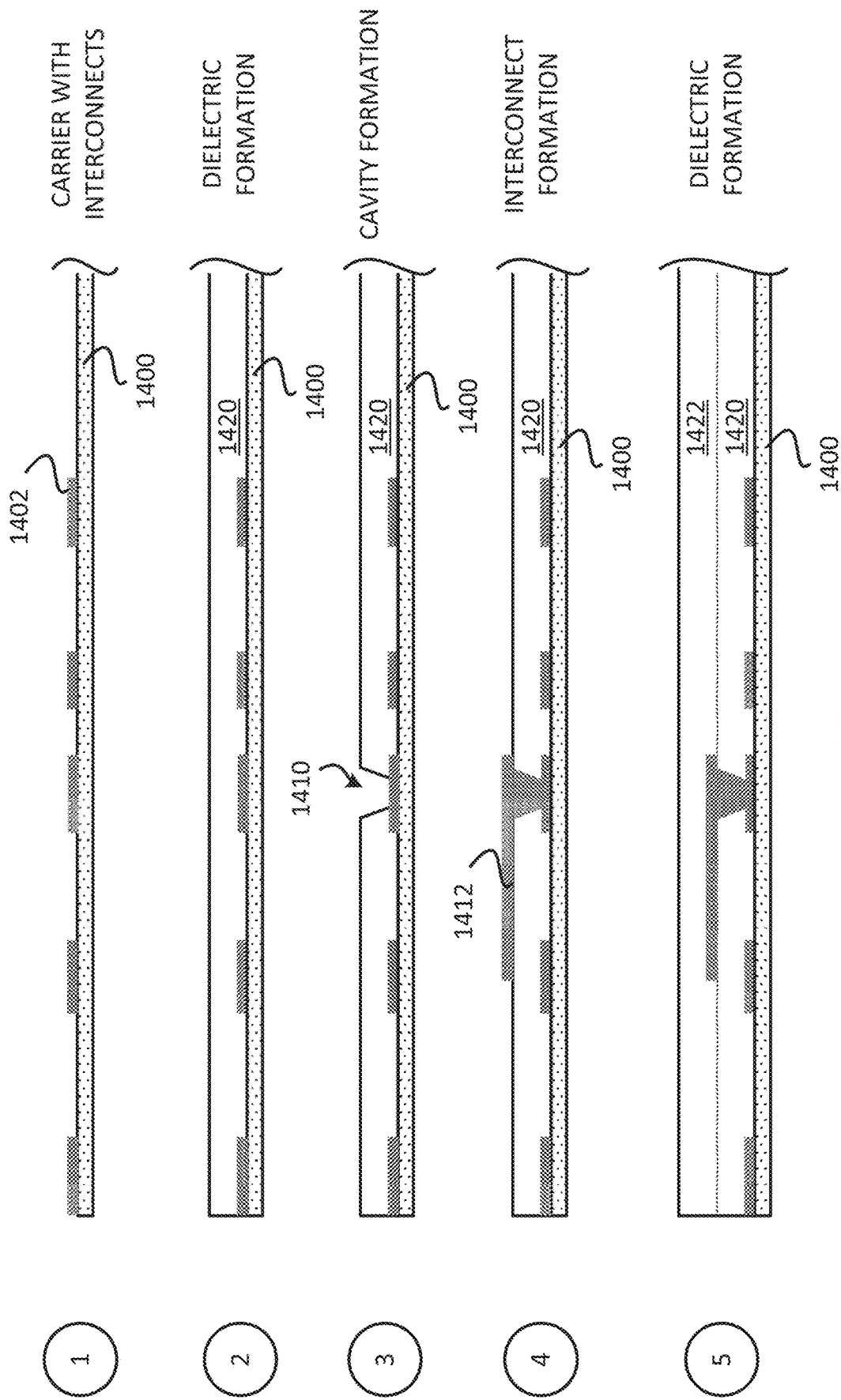
FIGS. 14A-14B illustrate an exemplary sequence for fabricating a substrate.
Figure 14B:
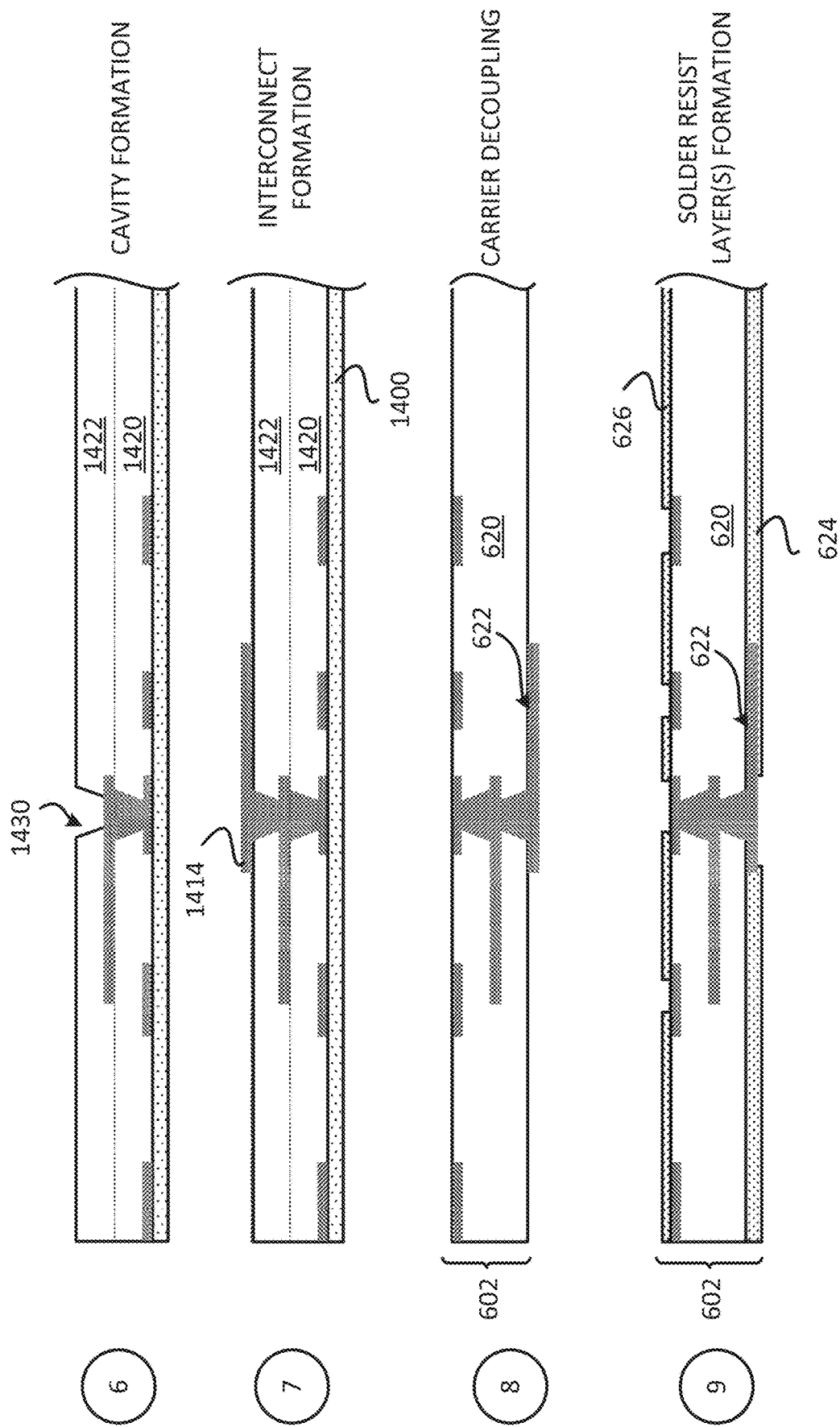

In some implementations, fabricating a substrate includes several processes. FIGS. 14A-14B illustrate an exemplary sequence for providing or fabricating a substrate. In some implementations, the sequence of FIGS. 14A-14B may be used to provide or fabricate the substrate 602 of FIG. 6. However, the process of FIGS. 14A-14B may be used to fabricate any of the substrates described in the disclosure.

It should be noted that the sequence of FIGS. 14A-14B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 14A, illustrates a state after a carrier 1400 is provided and a metal layer is formed over the carrier 1400. The metal layer may be patterned to form interconnects 1402. A plating process and etching process may be used to form the metal layer and interconnects. In some implementations, the carrier 1400 may be provided with a metal layer that is patterned to form the interconnects 1402.

Stage 2 illustrates a state after a dielectric layer 1420 is formed over the carrier 1400 and the interconnects 1402. A deposition and/or lamination process may be used to form the dielectric layer 1420. The dielectric layer 1420 may include polyimide. However, different implementations may use different materials for the dielectric layer.

Stage 3 illustrates a state after a plurality of cavities 1410 is formed in the dielectric layer 1420. The plurality of cavities 1410 may be formed using an etching process (e.g., photo etching process) or laser process.

Stage 4 illustrates a state after interconnects 1412 are formed in and over the dielectric layer 1420, including in and over the plurality of cavities 1410. For example, a via, pad and/or traces may be formed. A plating process may be used to form the interconnects.

Stage 5 illustrates a state after another dielectric layer 1422 is formed over the dielectric layer 1420. A deposition and/or lamination process may be used to form the dielectric layer 1422. The dielectric layer 1422 may be the same material as the dielectric layer 1420. However, different implementations may use different materials for the dielectric layer.

Stage 6, as shown in FIG. 14B, illustrates a state after a plurality of cavities 1430 is formed in the dielectric layer 1422. An etching process or laser process may be used to form the cavities 1430.

Stage 7 illustrates a state after interconnects 1414 are formed in and over the dielectric layer 1422, including in and over the plurality of cavities 1430. For example, via, pad and/or trace may be formed. A plating process may be used to form the interconnects.

It is noted that Stages 5 through 7 may be iteratively repeated to form addition metal layers and dielectric layers. Some or all of the interconnects 1402, 1412, and/or 1414 may define a plurality of interconnects 622 of the substrate 602. The dielectric layers 1420, and 1422 may be represented by the at least one dielectric layer 620.

Stage 8 illustrates a state after the carrier 1400 is decoupled (e.g., removed, grinded out) from the dielectric layer 620, leaving the substrate 602 that includes the at least one dielectric layer 620 and the plurality of interconnects 622.

Stage 9 illustrates a state after the solder resist layer 624 and the solder resist layer 626 are formed over the substrate 602. A deposition process may be used to form the solder resist layer 624 and the solder resist layer 626. In some implementations, none or one solder resist layer may be formed over the at least one dielectric layer 620.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 15:
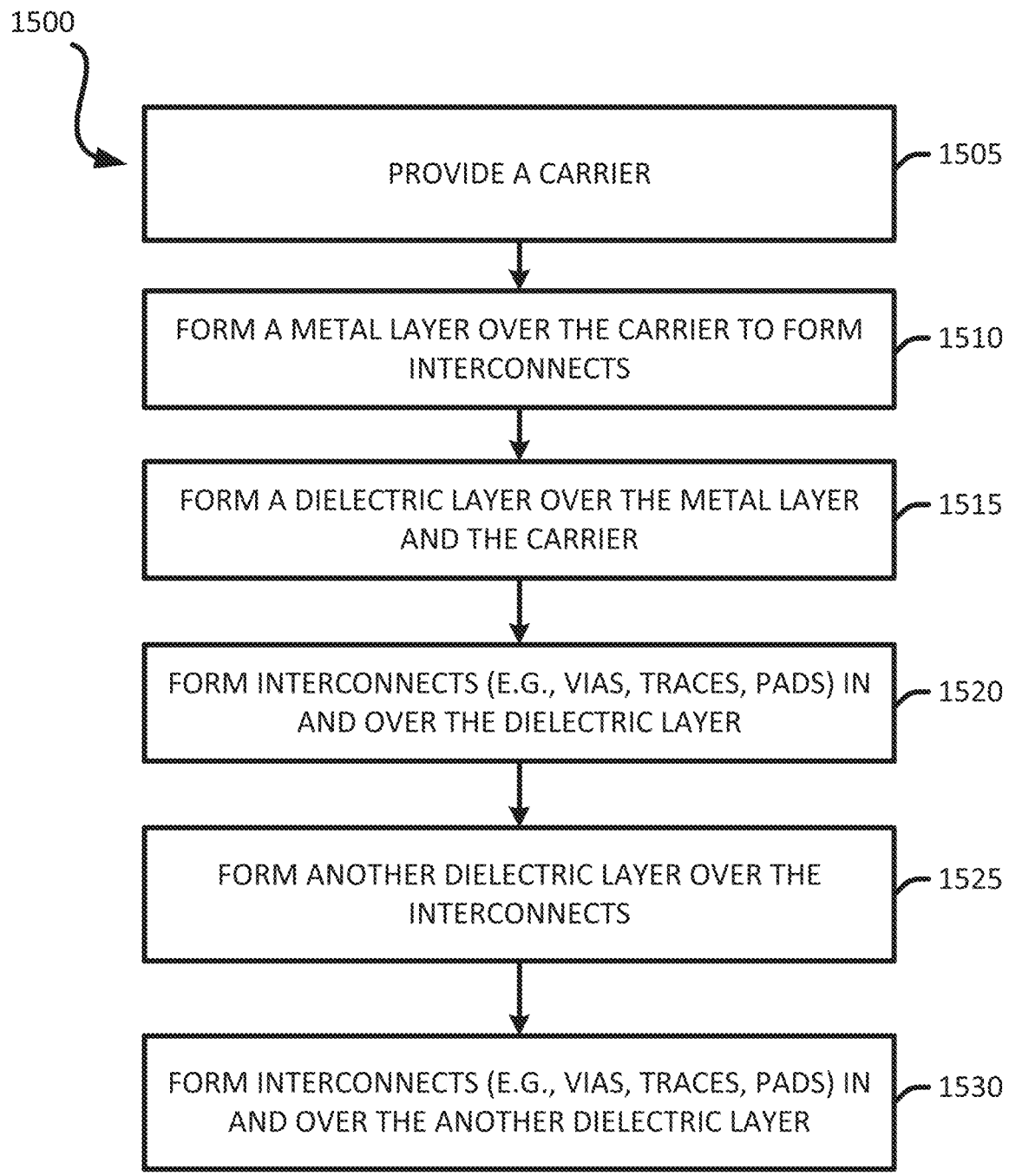
FIG. 15 illustrates an exemplary flow diagram of a method for fabricating a substrate.

In some implementations, fabricating a substrate includes several processes. FIG. 15 illustrates an exemplary flow diagram of a method 1500 for providing or fabricating a substrate. In some implementations, the method 1500 of FIG. 15 may be used to provide or fabricate the substrate(s) of FIG. 6. For example, the method of FIG. 15 may be used to fabricate the substrate 602.

It should be noted that the method 1500 of FIG. 15 may combine one or more processes in order to simplify and/or clarify the method for providing or fabricating a substrate. In some implementations, the order of the processes may be changed or modified.

The method provides (at 1505) a carrier 1400. Different implementations may use different materials for the carrier. The carrier may include a substrate, glass, quartz and/or carrier tape. Stage 1 of FIG. 14A illustrates and describes an example of a carrier that is provided.

The method forms (at 1510) a metal layer over the carrier 1400. The metal layer may be patterned to form interconnects. A plating process may be used to form the metal layer and interconnects. In some implementations, the carrier may include a metal layer. The metal layer over the carrier may be patterned to form interconnects (e.g., 1402). Stage 1 of FIG. 14A illustrates and describes an example of a metal layer and interconnects that are formed over a carrier.

The method forms (at 1515) a dielectric layer 1420 over the carrier 1400 and the interconnects 1402. A deposition and/or lamination process may be used to form the dielectric layer. The dielectric layer 1420 may include polyimide. Forming the dielectric layer may also include forming a plurality of cavities (e.g., 1410) in the dielectric layer 1420. The plurality of cavities may be formed using an etching process (e.g., photo etching) or laser process. Stages 2-3 of FIG. 14A illustrate and describe an example of forming a dielectric layer and cavities in the dielectric layer.

The method forms (at 1520) interconnects in and over the dielectric layer. For example, the interconnects 1412 may be formed in and over the dielectric layer 1420. A plating process may be used to form the interconnects. Forming interconnects may include providing a patterned metal layer over and/or in the dielectric layer. Forming interconnects may also include forming interconnects in cavities of the dielectric layer. Stage 4 of FIG. 14A illustrates and describes an example of forming interconnects in and over a dielectric layer.

The method forms (at 1525) a dielectric layer 1422 over the dielectric layer 1420 and the interconnects. A deposition and/or lamination process may be used to form the dielectric layer. The dielectric layer 1422 may include polyimide. Forming the dielectric layer may also include forming a plurality of cavities (e.g., 1430) in the dielectric layer 1422. The plurality of cavities may be formed using an etching process or laser process. Stages 5-6 of FIGS. 14A-14B illustrate and describe an example of forming a dielectric layer and cavities in the dielectric layer.

The method forms (at 1530) interconnects in and/or over the dielectric layer. For example, the interconnects 1414 may be formed. A plating process may be used to form the interconnects. Forming interconnects may include providing a patterned metal layer over an in the dielectric layer. Forming interconnects may also include forming interconnects in cavities of the dielectric layer. Stage 15 of FIG. 14B illustrates and describes an example of forming interconnects in and over a dielectric layer.

The method may form additional dielectric layer(s) and additional interconnects as described at 1525 and 1530.

Once all the dielectric layer(s) and additional interconnects are formed, the method may decouple (e.g., remove, grind out) the carrier (e.g., 1400) from the dielectric layer 1420, leaving the substrate. In some implementations, the method may form solder resist layers (e.g., 624, 626) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 16:
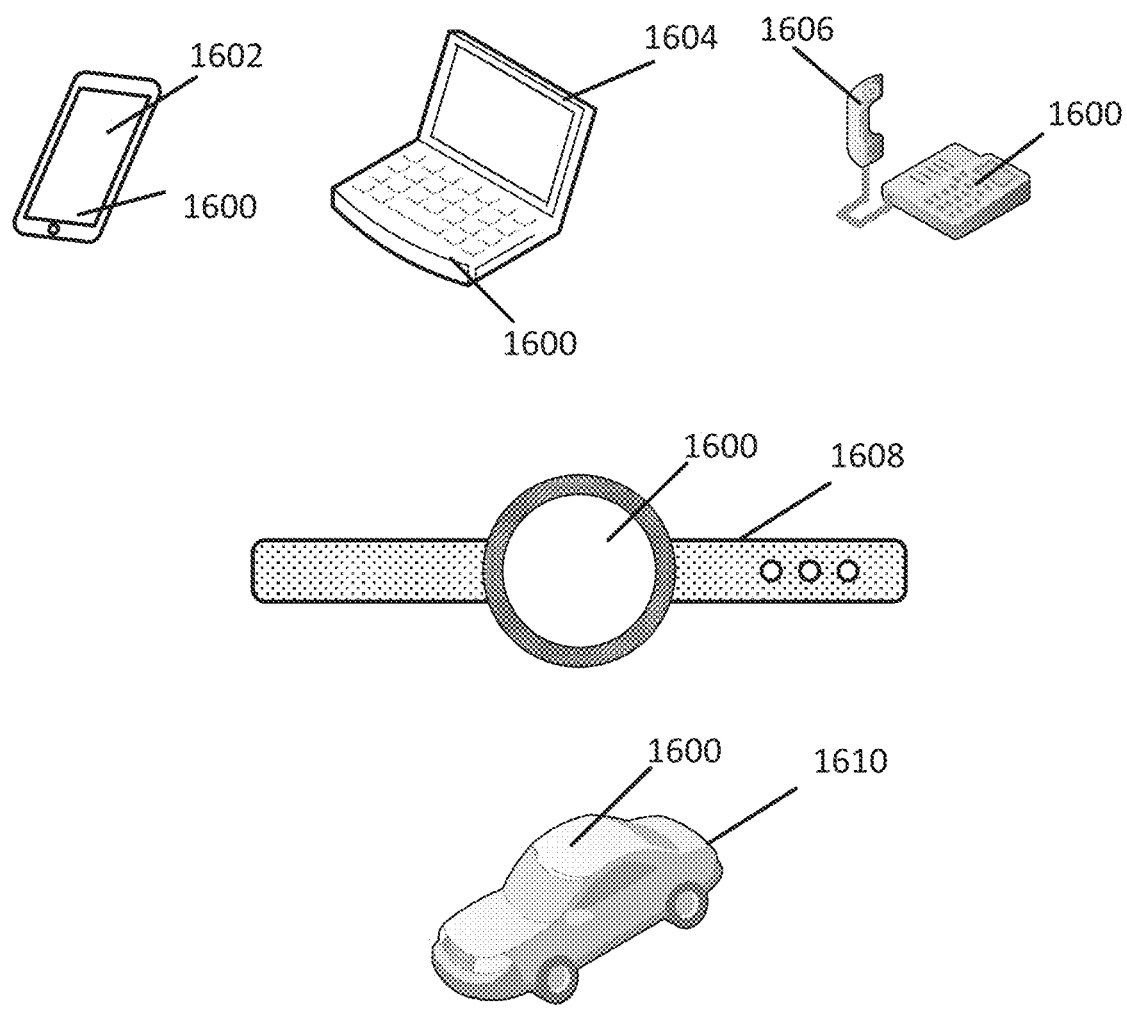
FIG. 16 illustrates various electronic devices that may integrate a die, an electronic circuit, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10C, 11-13, 14A-14B, and/or 15-16 may be rearranged and/or combined into a single component, process, feature or function or embodied in several components, processes, or functions. Additional elements, components, processes, and/or functions may also be added without departing from the disclosure. It should also be noted FIGS. 1-9, 10A-10C, 11-13, 14A-14B, and/or 15-16 and its corresponding description in the present disclosure is not limited to dies and/or ICs. In some implementations, FIGS. 1-9, 10A-10C, 11-13, 14A-14B, and/or 15-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate; an integrated device coupled to the substrate; and an integrated passive device coupled to the substrate, wherein the integrated passive device comprises: a first trench capacitor configured to be coupled to a first power; and a second trench capacitor configured to be coupled to a second power.

Aspect 2: The package of aspect 1, wherein the first trench capacitor is configured to be part of a first power distribution network, and wherein the second trench capacitor is configured to be part of a second power distribution network.

Aspect 3: The package of aspects 1 through 2, wherein the first trench capacitor is configured to be coupled to a first interconnect from the substrate, the first interconnect configured to provide an electrical path for a first power, and wherein the second trench capacitor is configured to be coupled to a second interconnect from the substrate, the second interconnect configured to provide an electrical path for a second power.

Aspect 4: The package of aspects 1 through 3, wherein the integrated device includes an internal integrated passive device, and wherein the first trench capacitor of the integrated passive device is configured to be electrically coupled to the internal integrated passive device.

Aspect 5: The package of aspects 1 through 4, further comprising a second integrated device, wherein the first trench capacitor of the integrated passive device is configured to be electrically coupled to the integrated device, and wherein the second trench capacitor of the integrated passive device is configured to be electrically coupled to the second integrated device.

Aspect 6: The package of aspects 1 through 5, wherein the integrated device includes a processor unit and a memory unit, wherein the first trench capacitor of the integrated passive device is configured to be electrically coupled to the processor unit, and wherein the second trench capacitor of the integrated passive device is configured to be electrically coupled to the memory unit.

Aspect 7: The package of aspects 1 through 6, wherein the integrated passive device comprises: a passive device substrate comprising a first trench and a second trench; an oxide layer located over the first trench and the second trench; a first electrically conductive layer located over the oxide layer the first trench; a dielectric layer located over the first electrically conductive layer; and a second electrically conductive layer located over the dielectric layer.

Aspect 8: The package of aspect 7, wherein a first portion of the oxide layer, a first portion of the first electrically conductive layer, a first portion of the dielectric layer, and a first portion of the second electrically conductive layer that are located in the first trench of the passive device substrate are configured to operate as the first trench capacitor, and wherein a second portion of the oxide layer, a second portion of the first electrically conductive layer, a second portion of the dielectric layer, and a second portion of the second electrically conductive layer that are located in the second trench of the passive device substrate are configured to operate as the second trench capacitor.

Aspect 9: The package of aspects 7 through 8, wherein the first electrically conductive layer is configured to be coupled to ground.

Aspect 10: The package of aspects 7 through 9, wherein the first electrically conductive layer and/or the second electrically conductive layer includes polysilicon.

Aspect 11: The package of aspect 10, wherein the first electrically conductive layer includes a dopant.

Aspect 12: The package of aspects 7 through 8, wherein the passive device substrate further comprises a third trench and a fourth trench, wherein a third portion of the oxide layer, a third portion of the first electrically conductive layer, a third portion of the dielectric layer and a third portion of the second electrically conductive layer are located in the third trench, and wherein a fourth portion of the oxide layer, a fourth portion of the first electrically conductive layer, a fourth portion of the dielectric layer and a fourth portion of the second electrically conductive layer are located in the fourth trench.

Aspect 13: The package of aspect 12, wherein the third portion of oxide layer, the third portion of the first electrically conductive layer, the third portion of the dielectric layer and the third portion of the second electrically conductive layer are configured to operate as a third trench capacitor.

Aspect 14: The package of aspect 12, wherein the third portion of the oxide layer, the third portion of the first electrically conductive layer, the third portion of the dielectric layer and the third portion of the second electrically conductive layer are configured to operate as the first trench capacitor.

Aspect 15: The package of aspects 12 through 14, wherein the fourth portion of the oxide layer, the fourth portion of the first electrically conductive layer, the fourth portion of the dielectric layer and the fourth portion of the second electrically conductive layer are configured to operate as the second trench capacitor.

Aspect 16: The package of aspects 7 through 15, wherein a plurality of portions of the second electrically conductive layer is configured as a plurality of pads for the integrated passive device.

Aspect 17: The package of aspect 16, wherein a portion of the first electrically conductive layer is configured as a ground pad for the integrated passive device.

Aspect 18: An apparatus comprising: a substrate; an integrated device coupled to the substrate; and means for multi-trench capacitance coupled to the substrate.

Aspect 19: The apparatus of aspect 18, wherein the means for multi-trench capacitance comprises: means for first trench capacitance; and means for second trench capacitance.

Aspect 20: The apparatus of aspect 19, wherein the means for first trench capacitance and the means for second trench capacitance share an electrically conductive layer configured to be coupled to ground.

Aspect 21: The apparatus of aspects 19 through 20, wherein the means for first trench capacitance comprises: a first trench in the passive device substrate; a first portion of an oxide layer located in the first trench; a first portion of a first electrically conductive layer over the oxide layer; a first portion of a dielectric layer located over the first electrically conductive layer; and a first portion of a second electrically conductive layer located over the dielectric layer.

Aspect 22: The apparatus of aspect 21, wherein the means for second trench capacitance comprises: a second trench in the passive device substrate; a second portion of an oxide layer located in the first trench; a second portion of a first electrically conductive layer over the oxide layer; a second portion of a dielectric layer located over the first electrically conductive layer; and a second portion of a second electrically conductive layer located over the dielectric layer.

Aspect 23: The apparatus of aspect 22, wherein the first electrically conductive layer is configured to be coupled to ground.

Aspect 24: The apparatus of aspects 19 through 23, wherein the means for first trench capacitance is configured to be part of a first power distribution network, and wherein the means for second trench capacitance is configured to be part of a second power distribution network.

Aspect 25: The apparatus of aspects 19 through 24, wherein the means for first trench capacitance is formed in one or more trench.

Aspect 26: The apparatus of aspects 19 through 25, wherein the means for first trench capacitance is configured to be electrically coupled to the integrated device.

Aspect 27: The apparatus of aspects 19 through 26, wherein the means for first trench capacitance is configured to be electrically coupled to an internal integrated passive device of the integrated device.

Aspect 28: The apparatus of aspects 18 through 27, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 29: A method for fabricating a package, comprising: providing a substrate; coupling an integrated device to the substrate; and coupling an integrated passive device to the substrate, wherein the integrated passive device comprises: a first trench capacitor configured to be coupled to a first power; and a second trench capacitor configured to be coupled to a second power.

Aspect 30: The method of aspect 29, further comprising coupling a second integrated device to the integrated device.

Aspect 31: The method of aspect 30, wherein the first capacitor is configured to be coupled to the integrated device, and wherein the second capacitor is configured to be coupled to the second integrated device. The integrated passive device comprises: a passive device substrate comprising a first trench and a second trench; an oxide layer located over the first trench and the second trench; a first electrically conductive layer located over the oxide layer the first trench; a dielectric layer located over the first electrically conductive layer; and a second electrically conductive layer located over the dielectric layer, wherein a first portion of the oxide layer, a first portion of the first electrically conductive layer, a first portion of the dielectric layer, and a first portion of the second electrically conductive layer that are located in the first trench of the passive device substrate are configured to operate as the first trench capacitor, and wherein a second portion of the oxide layer, a second portion of the first electrically conductive layer, a second portion of the dielectric layer, and a second portion of the second electrically conductive layer that are located in the second trench of the passive device substrate are configured to operate as the second trench capacitor.

Aspect 32: An integrated passive device comprising: a passive device substrate comprising a first trench and a second trench; an oxide layer located over the first trench and the second trench; a first electrically conductive layer located over the oxide layer the first trench; a dielectric layer located over the first electrically conductive layer; and a second electrically conductive layer located over the dielectric layer, wherein a first portion of the oxide layer, a first portion of the first electrically conductive layer, a first portion of the dielectric layer, and a first portion of the second electrically conductive layer that are located in the first trench of the passive device substrate are configured to operate as a first capacitor, and wherein a second portion of the oxide layer, a second portion of the first electrically conductive layer, a second portion of the dielectric layer, and a second portion of the second electrically conductive layer that are located in the second trench of the passive device substrate are configured to operate as a second capacitor.

Aspect 33: The integrated passive device of aspect 32, wherein the first electrically conductive layer is configured to be coupled to ground.

Aspect 34: The integrated passive device of aspects 32 through 33, wherein the first capacitor is configured to be part of a first power distribution network, and wherein the second capacitor is configured to be part of a second power distribution network.

Aspect 35: The integrated passive device of aspects 32 through 34, wherein the first electrically conductive layer and/or the second electrically conductive layer includes polysilicon.

Aspect 36: The integrated passive device of aspect 35, wherein the first electrically conductive layer includes a dopant.

Aspect 37: The integrated passive device of aspects 32 through 36, wherein the oxide layer and/or the dielectric layer includes $SiO_2$ (e.g., LPCVD $SiO_2$) or $Si_3N_4$ (e.g., LPCVD $Si_3N_4$).

Aspect 38: A method for fabricating an integrated passive device. The method provides a passive device substrate. The method forms a first trench and a second trench in the passive device substrate. The method forms an oxide layer over the first trench and the second trench. The method forms a first electrically conductive layer over the oxide layer the first trench. The method forms a dielectric layer over the first electrically conductive layer. The method forms a second electrically conductive layer located over the dielectric layer. A first portion of the oxide layer, a first portion of the first electrically conductive layer, a first portion of the dielectric layer, and a first portion of the second electrically conductive layer that are located in the first trench of the passive device substrate are configured to operate as a first capacitor. A second portion of the oxide layer, a second portion of the first electrically conductive layer, a second portion of the dielectric layer, and a second portion of the second electrically conductive layer that are located in the second trench of the passive device substrate are configured to operate as a second capacitor.

Aspect 39: The method of aspect 38, wherein the first electrically conductive layer is configured to be coupled to ground.

Aspect 40: The method of aspects 38 through 39, wherein the first capacitor is configured to be part of a first power distribution network, and wherein the second capacitor is configured to be part of a second power distribution network.

Aspect 41: The method of aspects 38 through 40, wherein the first electrically conductive layer and/or the second electrically conductive layer includes polysilicon.

Aspect 42: The method of aspect 41, wherein the first electrically conductive layer includes a dopant.

Aspect 43: The method of aspects 38 through 42, wherein the oxide layer and/or the dielectric layer includes $SiO_2$ (e.g., LPCVD $SiO_2$) or $Si_3N_4$ (e.g., LPCVD $Si_3N_4$).

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate;
an integrated device coupled to the substrate, the integrated device includes a processor unit and a memory unit; and
an integrated passive device coupled to the substrate, wherein the integrated passive device comprises:
a first trench capacitor configured to be electrically coupled to the processor unit and a first power; and
a second trench capacitor configured to be electrically coupled to the memory unit and a second power.

2. The package of claim 1,
wherein the first trench capacitor is configured to be part of a first power distribution network, and
wherein the second trench capacitor is configured to be part of a second power distribution network.

3. The package of claim 1,
wherein the first trench capacitor is configured to be coupled to a first interconnect from the substrate, the first interconnect configured to provide an electrical path for the first power, and
wherein the second trench capacitor is configured to be coupled to a second interconnect from the substrate, the second interconnect configured to provide an electrical path for the second power.

4. The package of claim 1,
wherein the integrated device includes an internal integrated passive device, and
wherein the first trench capacitor of the integrated passive device is configured to be electrically coupled to the internal integrated passive device.

5. The package of claim 1, further comprising:
a second integrated device;
wherein a third trench capacitor of the integrated passive device is configured to be electrically coupled to the second integrated device.

6. The package of claim 1, wherein the integrated passive device comprises:
a passive device substrate comprising a first trench and a second trench;
an oxide layer located over the first trench and the second trench;
a first electrically conductive layer located over the oxide layer the first trench;
a dielectric layer located over the first electrically conductive layer; and
a second electrically conductive layer located over the dielectric layer.

7. The package of claim 6,
wherein a first portion of the oxide layer, a first portion of the first electrically conductive layer, a first portion of the dielectric layer, and a first portion of the second electrically conductive layer that are located in the first trench of the passive device substrate are configured to operate as the first trench capacitor, and
wherein a second portion of the oxide layer, a second portion of the first electrically conductive layer, a second portion of the dielectric layer, and a second portion of the second electrically conductive layer that are located in the second trench of the passive device substrate are configured to operate as the second trench capacitor.

8. The package of claim 7, wherein the first electrically conductive layer is configured to be coupled to ground.

9. The package of claim 7, wherein the first electrically conductive layer and/or the second electrically conductive layer includes polysilicon.

10. The package of claim 9, wherein the first electrically conductive layer includes a dopant.

11. The package of claim 7,
wherein the passive device substrate further comprises a third trench and a fourth trench,
wherein a third portion of the oxide layer, a third portion of the first electrically conductive layer, a third portion of the dielectric layer and a third portion of the second electrically conductive layer are located in the third trench, and
wherein a fourth portion of the oxide layer, a fourth portion of the first electrically conductive layer, a fourth portion of the dielectric layer and a fourth portion of the second electrically conductive layer are located in the fourth trench.

12. The package of claim 11, wherein the third portion of oxide layer, the third portion of the first electrically conductive layer, the third portion of the dielectric layer and the third portion of the second electrically conductive layer are configured to operate as a third trench capacitor.

13. The package of claim 11, wherein the third portion of the oxide layer, the third portion of the first electrically conductive layer, the third portion of the dielectric layer and the third portion of the second electrically conductive layer are configured to operate as the first trench capacitor.

14. The package of claim 13, wherein the fourth portion of the oxide layer, the fourth portion of the first electrically conductive layer, the fourth portion of the dielectric layer and the fourth portion of the second electrically conductive layer are configured to operate as the second trench capacitor.

15. The package of claim 6, wherein a plurality of portions of the second electrically conductive layer is configured as a plurality of pads for the integrated passive device.

16. The package of claim 15, wherein a portion of the first electrically conductive layer is configured as a ground pad for the integrated passive device.

17. A method for fabricating a package, comprising:
providing a substrate;
coupling an integrated device that includes a processor unit and a memory unit to the substrate; and
coupling an integrated passive device to the substrate, wherein the integrated passive device comprises:
 a first trench capacitor configured to be electrically coupled to the processor unit and a first power; and
 a second trench capacitor configured to be electrically coupled to the memory unit and a second power.

18. The method of claim 17, further comprising coupling a second integrated device to the integrated device.

19. The method of claim 18,
wherein a third trench capacitor is configured to be coupled to the second integrated device.

20. A package comprising:
a substrate;
an integrated device coupled to the substrate; and
an integrated passive device coupled to the substrate, wherein the integrated passive device comprises:
 a first trench capacitor configured to be coupled to a first power;
 a second trench capacitor configured to be coupled to a second power;
 a passive device substrate comprising a first trench and a second trench;
 an oxide layer located over the first trench and the second trench;
 a first electrically conductive layer located over the oxide layer the first trench;
 a dielectric layer located over the first electrically conductive layer; and
 a second electrically conductive layer located over the dielectric layer;
 wherein a first portion of the oxide layer, a first portion of the first electrically conductive layer, a first portion of the dielectric layer, and a first portion of the second electrically conductive layer that are located in the first trench of the passive device substrate are configured to operate as the first trench capacitor;
 wherein a second portion of the oxide layer, a second portion of the first electrically conductive layer, a second portion of the dielectric layer, and a second portion of the second electrically conductive layer that are located in the second trench of the passive device substrate are configured to operate as the second trench capacitor;
 wherein the passive device substrate further comprises a third trench and a fourth trench;
 wherein a third portion of the oxide layer, a third portion of the first electrically conductive layer, a third portion of the dielectric layer and a third portion of the second electrically conductive layer are located in the third trench; and
 wherein a fourth portion of the oxide layer, a fourth portion of the first electrically conductive layer, a fourth portion of the dielectric layer and a fourth portion of the second electrically conductive layer are located in the fourth trench.

21. The package of claim 20, wherein the first electrically conductive layer is configured to be coupled to ground.

22. The package of claim 20, wherein the first electrically conductive layer and/or the second electrically conductive layer includes polysilicon.

23. The package of claim 20, wherein the third portion of oxide layer, the third portion of the first electrically conductive layer, the third portion of the dielectric layer and the third portion of the second electrically conductive layer are configured to operate as a third trench capacitor.

24. The package of claim 20, wherein the third portion of the oxide layer, the third portion of the first electrically conductive layer, the third portion of the dielectric layer and the third portion of the second electrically conductive layer are configured to operate as the first trench capacitor.

25. The package of claim 20, wherein the fourth portion of the oxide layer, the fourth portion of the first electrically conductive layer, the fourth portion of the dielectric layer and the fourth portion of the second electrically conductive layer are configured to operate as the second trench capacitor.

26. The package of claim 20, wherein a plurality of portions of the second electrically conductive layer is configured as a plurality of pads for the integrated passive device.

27. The package of claim 20, wherein a portion of the first electrically conductive layer is configured as a ground pad for the integrated passive device.

* * * * *